United States Patent
Maeda et al.

(10) Patent No.: US 6,911,503 B2
(45) Date of Patent: Jun. 28, 2005

(54) CURING AGENT COMPOSITION FOR EPOXY RESINS, EPOXY RESIN COMPOSITION AND USE THEREOF

(75) Inventors: Sunao Maeda, Sodegaura (JP); Tatsuhiro Urakami, Sodegaura (JP); Tomoyuki Kawabata, Sodegaura (JP); Koutarou Suzuki, Sodegaura (JP); Tadahito Nobori, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 189 days.

(21) Appl. No.: 10/432,368

(22) PCT Filed: Sep. 27, 2002

(86) PCT No.: PCT/JP02/09992
§ 371 (c)(1), (2), (4) Date: May 21, 2003

(87) PCT Pub. No.: WO03/029322
PCT Pub. Date: Apr. 10, 2003

(65) Prior Publication Data
US 2004/0044167 A1 Mar. 4, 2004

(30) Foreign Application Priority Data

Sep. 28, 2001 (JP) .................. 2001-302165
Sep. 28, 2001 (JP) .................. 2001-302166

(51) Int. Cl.$^7$ .................. C08L 61/10; C08L 61/14; C08L 63/04; C09K 3/10; H01L 23/29
(52) U.S. Cl. .................. 525/485; 252/182.24; 252/182.27; 257/793; 525/480; 525/508; 525/523
(58) Field of Search .................. 252/182.24, 182.27; 257/793; 525/480, 485, 508, 523

(56) References Cited

U.S. PATENT DOCUMENTS 5,990,352 A * 11/1999 Nobori et al. .................. 564/12

FOREIGN PATENT DOCUMENTS

EP 959088 A2 11/1999
JP 10-77289 A 3/1998
JP 2000-319358 A 11/2000
JP 2000-327747 A 11/2000
JP 2000327747 A * 11/2000 .......... C08G/59/32
JP 2000-327748 A 11/2000
JP 2001-26644 A 1/2001
JP 2001026644 A * 1/2001 .......... C08G/65/10
JP 2004018720 A * 1/2004 .......... C09J/163/00

* cited by examiner

*Primary Examiner*—Robert Sellers
(74) *Attorney, Agent, or Firm*—Burns, Doane, Swecker & Mathis, LLP

(57) ABSTRACT

An epoxy resin composition comprising an epoxy resin (A), a curing agent (B) and a curing accelerator (C), wherein the curing agent (B) is a phenol compound having two or more hydroxyl functional groups or a compound obtained by esterification of the phenol compound or a mixture of these compounds, and the curing accelerator (C) is a salt of a phosphazenium compound represented by a formula (I):

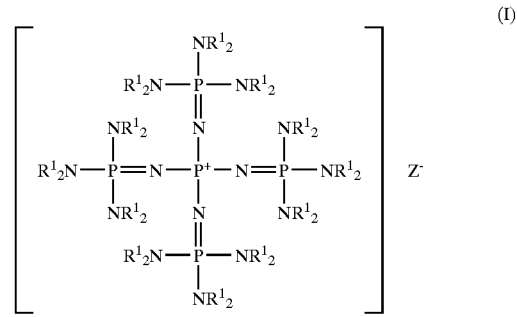

(wherein $R^1$s each represent a hydrogen atom, a linear, branched or cyclic alkyl group having 1 to 10 carbon atoms or an aryl or aralkyl group having 6 to 10 carbon atoms and may be all the same or different from one another; and $Z^-$ represents a halogen anion, hydroxy anion, alkoxy anion, aryloxy anion or carboxy anion).

12 Claims, 1 Drawing Sheet

CURING AGENT COMPOSITION FOR EPOXY RESINS, EPOXY RESIN COMPOSITION AND USE THEREOF

TECHNICAL FIELD

The present invention relates to a semiconductor device obtained by sealing a semiconductor integrated circuit with an epoxy resin. The present invention provides an epoxy resin composition which has various physical properties satisfactory to make the composition usable for its application, e.g., low hygroscopicity and excellent melt-flowability of the resin composition in particular and which provides overall cracking resistance. Further, the present invention also relates to an epoxy resin composition comprising a catalyst which causes a functional group such as a phenolic hydroxyl group or an ester group to react with an epoxy group quickly, and a cured product of the epoxy resin composition.

BACKGROUND ART

Heretofore, integrated circuits (IC) and large scale integrated circuit (LSI) have been protected from malfunctions caused by dirt, dust, heat, moisture or light in an external atmosphere by sealants for protecting them in order for the circuits to be actually used.

In recent years, the sealants have been gradually shifted from sealing with metal materials and ceramic materials to sealing with resins, and at present, epoxy resin sealants are predominantly used.

In particular, in view of balance between costs and physical properties, epoxy resin compositions using a phenol resin as a curing agent are used in large quantities. The sealants using these epoxy resin compositions have problems such as improvement in mechanical properties as well as:

(i) suppression of crack occurrence at the time of reflow soldering, and (ii) improvement in electrical reliability.

Generally, the occurrence of cracks at the time of reflow soldering in (i) is assumed to be caused by water in the resin which expands sharply when exposed to high temperatures at the time of reflow soldering. Hence, means for solving the problem is largely focused on control of moisture absorptivity of the resin, and mechanical strength and adhesion of the resin to metal are also involved in the means on the whole.

However, since a reaction between an epoxy group and a hydroxyl group is a reaction which always produces a hydroxyl group as shown by the following reaction formula (1), hydrophilicity becomes higher due to the hydroxyl group, and even if a basic skeleton is rendered hydrophobic, a reduction in the moisture absorptivity as a whole is limited. Reaction Formula (1):

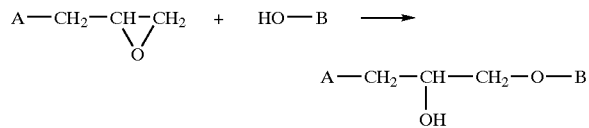

(wherein A represents an epoxy residue, and B represents a phenol residue).

As a technique for solving these problems, a technique disclosed in, for example, EP 959088 which uses a phosphine oxide derivative as a curing accelerator has been studied.

Since an epoxy resin composition using the accelerator is cured by use of the phenol resin, moisture absorptivity is almost the same as that when triphenylphosphine or imidazole which is a commonly used accelerator is used. As for improvements in other physical properties, however, a significant improvement in cracking resistance is seen.

Further, its curing behavior has a significantly great merit from an industrial standpoint in that initial curing takes long time and complete curing takes short time.

Meanwhile, with respect to the improvement in electrical reliability in (ii), the following problems exist.

(ii)-1: As a side reaction at the time of curing, epoxy homopolymerization occurs in some portions. As a result, hydroxyl groups of the phenol resin become excessive, so that the composition has poor moisture resistance and electric characteristics. Further, since the epoxy homopolymerized portions and the excessive phenol resin portions exist in addition to an essential epoxy-phenol resin network, the composition also has poor mechanical properties.

(ii)-2: Mainly due to corrosion of metal portions and current leakage of a semiconductor which are caused by incorporation of free ions, halogen ions in particular, the electrical reliability is adversely affected.

Of these, the ion impurities in (ii)-2 are a problem of purification and purity of the epoxy resin in particular and are not intrinsic. As for the problem of (ii)1, modification of the resin and/or control of the side reaction can cause the epoxy resin composition to fully exhibit physical properties inherent in the epoxy resin composition.

These problems indicated by (ii)-1 and (ii)-2 influence a technique to be described hereinafter.

That is, for the purpose of reducing the moisture absorptivity of the resin in the foregoing problem (i), a reaction between an epoxy group and an ester group as disclosed in Japanese Patent Application Laid-Open No. 53327/1987 applied by Nishikubo et al. has been proposed.

In the publication, a quaternary onium salt and a crown ether complex are set forth as preferable catalysts, and in a paper [Addition Reaction of Epoxy Compound with Ester and Its Application to Synthesis of Polymer, Synthetic Organic Chemistry, Vol. 49, pp. 218 to 233 (1991)] by Nishikubo et al., yields when the catalysts are used as unit reactions are specifically described. According to the paper, although the highest yield is 91% which is a yield when tetrabutylammonium chloride is used, the yields are generally low.

It is needless to say that if an ionic compound such as the quaternary onium salt and the crown ether complex remain in a resin used as a sealant for a semiconductor integrated circuit, this means that the ionic impurities described in the foregoing (ii)-1 are added as a curing accelerator, thereby causing undesirable results such as an electrical short circuit as well as corrosion of metal portions in contact with the impurities, and these undesirable results and the corrosion in turn cause serious defects in products.

Meanwhile, in a general addition reaction between an epoxy resin and a phenol resin, a phosphine such as trialkylphosphine or triarylphosphine, imidazole, a tertiary amine or the like is used as a catalyst, and particularly for sealing a semiconductor, imidazole and the phosphines are often used. When these catalysts are used in the reaction between an epoxy group and an ester group, imidazole having reaction activity is liable to cause epoxy homopolymerization which is the foregoing side reaction, and the problem of the foregoing (ii)-2 is remarkable. On the other hand, although the phosphines do not have these problems, they have slow curing speed and provide substantially no cured product.

Therefore, the idea of preparing a curing agent for an epoxy resin by esterifying some or all hydroxyl groups of the phenol resin as the curing agent for the purpose of obtaining lower hygroscopicity has heretofore not been implemented because no effective curing catalyst has been available.

Under such circumstances, in recent years, a phosphazene catalyst for curing an ester group and an epoxy group effectively has been proposed. More specifically, it has been found that the phosphine oxide derivative disclosed in the foregoing EP 959088 is effective for an epoxy-ester curing reaction. Japanese Patent Application Laid-Open No. 80049/2000 discloses its production and high activity in a unit reaction between an epoxy group and an ester group (reaction between monofunctional compounds), and Japanese Patent Application Laid-Open No. 349662/1999 discloses its application to a sealant.

However, it has been found that due to hydrolytic properties of the phosphine oxide derivative, if a cured resin absorbs water with the derivative contained therein and is exposed to high temperatures as in reflow soldering, the derivative is decomposed easily, and electric conductivity increases significantly. That is, the phosphine oxide derivative is not suitable as a sealant in some cases.

Further, a phosphazenium compound which is a curing catalyst is already disclosed in Japanese Patent Application Laid-Open No. 77289/1998 which also discloses that the phosphazenium compound exhibits high activity in a unit reaction between an epoxy group and an ester group.

In consideration of these facts, it may seem to be easy to use the phosphazenium compound together with an epoxy resin having two or more functional epoxy groups and a phenol resin having two or more functional groups or an ester derivative thereof as a thermosetting resin. However, it is generally known that a basic reaction does not necessarily exhibit the same level of reaction activity under a reaction in a polymer.

That is, it must be considered in the case of a three-dimensional crosslinking curing reaction that as three-dimensional crosslinking proceeds, skeletal steric hindrance occurs due to bondings occurring in the vicinity of functional groups and molecules are fixed along with curing, so that the curing reaction may not proceed easily.

When the ionic phosphazenium compound is used as a catalyst, it is conceivable that the compound may not be a favorable catalyst for a sealant with respect to which control of inclusion of ionic substances is generally strict.

Under the circumstances, in the present invention, an epoxy resin composition suitable for use as a sealant, a cured product thereof, and a curing agent composition for the epoxy resin composition.

DISCLOSURE OF THE INVENTION

An object of the present invention is to provide a composition for causing a phenol resin for providing a cured epoxy resin resin having low hygroscopicity and excellent electric characteristics or an ester derivative thereof resulting from esterification of some or all hydroxyl groups of the phenol resin with an aliphatic acyl group or aromatic acyl group to react with an epoxy resin or compound effectively. In particular, an object of the present invention is to provide an epoxy resin composition for a semiconductor sealant which is excellent in cracking resistance and electric characteristics, a cured product of the composition, a semiconductor device produced by use of the composition, and a curing agent composition for an epoxy resin.

The present inventors have found that such objects can be achieved by a specific compound comprising a stable cation and a counter anion and have completed the present invention on the basis of this finding.

That is, the present invention is a curing agent composition for an epoxy resin which comprises a compound as a curing agent (B) which is selected from the group consisting of the following (B1) to (B3):

(B1) a phenol compound having two or more hydroxyl functional groups, (B2) a compound in which a hydroxyl group of a phenol compound having two or more hydroxyl functional groups is esterified with an acyl group, and (B3) a mixture of the above compounds (B1) and (B2), and a salt of a phosphazenium compound as a curing accelerator (C) which is represented by the following formula (I):

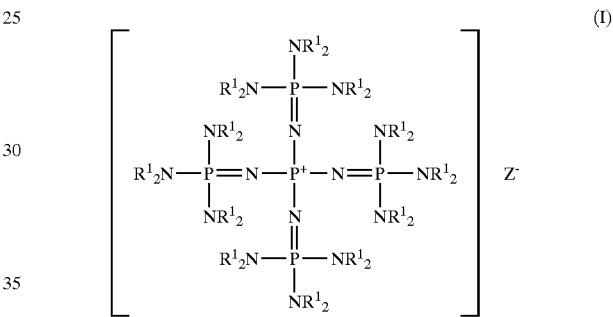

(wherein $R^1$s each represent a hydrogen atom, a linear, branched or cyclic alkyl group having 1 to 10 carbon atoms or an aryl or aralkyl group having 6 to 10 carbon atoms and may be all the same or different from one another; and $Z^-$ represents a halogen anion, hydroxy anion, alkoxy anion, aryloxy anion or carboxy anion).

Further, the present invention is an epoxy resin composition comprising:

(A) an epoxy resin having two or more epoxy groups in a molecule, (B) a curing agent, and (C) a curing accelerator, wherein the curing agent (B) is a compound selected from the group consisting of the following (B1) to (B3):

(B1) a phenol compound having two or more hydroxyl functional groups, (B2) a compound in which a hydroxyl group of a phenol compound having two or more hydroxyl functional groups is esterified with an acyl group, and (B3) a mixture of the above (B1) and (B2), and the curing accelerator (C) is a salt of a phosphazenium compound which is represented by the above formula (I).

Still further, the present invention is a cured epoxy resin obtained by heat-curing the foregoing epoxy resin composition.

Still further, the present invention is a semiconductor device obtained by sealing a semiconductor integrated circuit by use of the foregoing epoxy resin composition.

Still further, the present invention is an epoxy resin composition comprising:
(A) an epoxy resin having two or more epoxy groups in a molecule,
(B) a curing agent, and
(C) a curing accelerator,
wherein the curing agent (B) is a compound selected from the group consisting of the following (B1) to (B3):
(B1) a phenol compound having two or more hydroxyl functional groups,
(B2) a compound in which a hydroxyl group of a phenol compound having two or more hydroxyl functional groups is esterified with an acyl group, and
(B3) a mixture of the above (B1) and (B2),
and the curing accelerator (C) is a salt comprising a stable cation and a counter anion.

BEST MODE FOR CARRYING OUT THE INVENTION

Figure 1:
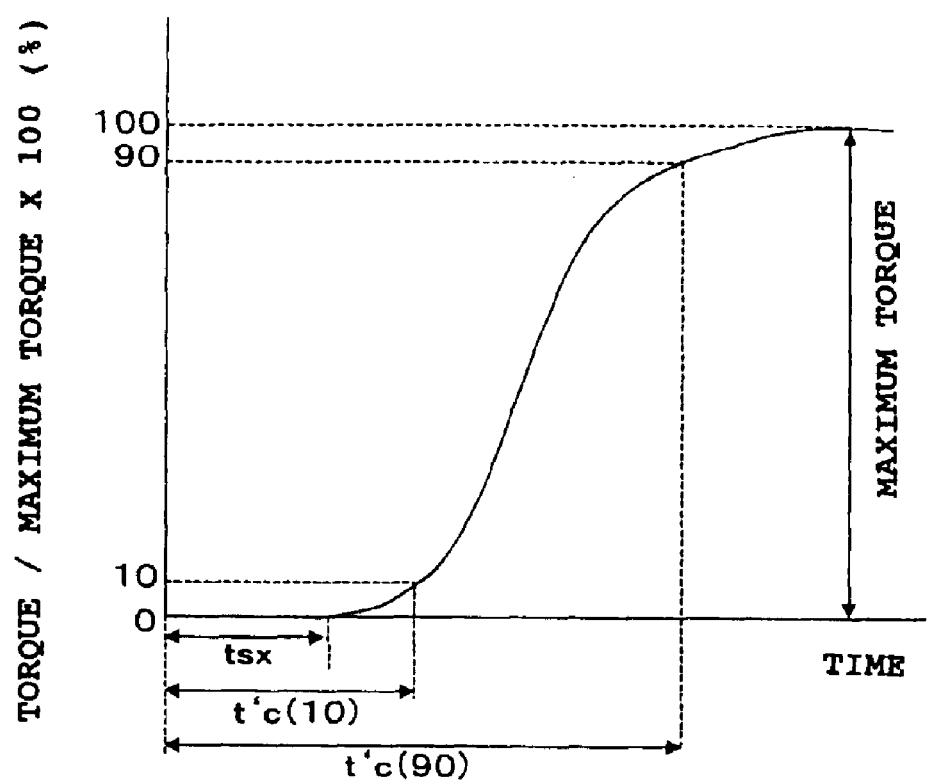
FIG. 1 is a graph showing the curing behavior of an epoxy resin composition when CURELASTOMETER is used.

In the present invention, as a curing accelerator (C), a salt comprising a stable cation and a counter anion typified by a salt of a phosphazenium compound which is represented by the foregoing formula (1) is used, and as the curing agent (B), a compound selected from the group consisting of the following (B1) to (B3)is used:
(B1) a phenol compound having two or more hydroxyl functional groups,
(B2) a compound in which a hydroxyl group of a phenol compound having two or more hydroxyl functional groups is esterified with an acyl group, and
(B3) a mixture of the above (B1) and (B2), When the mixture (B3) is used, a mixing ratio of the compound (B1) and the compound (B2) is arbitrary and should be determined by determining desired physical properties of a cured product according to target application and grade.

That is, hygroscopicity lowers as the number of ester groups increases, while adhesion to metal such as a lead frame improves as the number of hydroxyl groups increases, whereby mechanical strength is improved.

In the epoxy resin composition of the present invention, when the phosphazenium compound of the formula (1) is used as the essential accelerator, a reaction between an epoxy group and an ester group which has conventionally been unable to proceed to a sufficient degree can fully proceed as a curing reaction, a problem of the side reaction of the foregoing problem (ii) can be solved, and a cured product which is excellent particularly in flexibility, moisture resistance, cracking resistance and electric characteristics can be provided, as compared with when conventional imidazole or triphenylphosphine is used as the accelerator.

Further, even when an unesterified phenol resin is used, heat resistance is improved and complete curing becomes fast, as compared with when the conventional accelerator is used.

In addition, a resin composition prepared by adding an organic and/or inorganic filler(s) (D) to the epoxy resin composition exhibits extremely excellent performance as a sealant for a semiconductor integrated circuit.

Meanwhile, as compared with the aforementioned prior art using a phosphine oxide derivative as a curing accelerator, electrical reliability as electrical and electronic products improves.

That is, while the phosphine oxide derivative has hydrolytic properties as a compound and has a problem with respect to electrical reliability, the phosphazenium compound used in the present invention is stable. Thus, the difference in electrical reliability occurs.

That is, the epoxy resin composition of the present invention is preferably an epoxy resin composition comprising:
(A) an epoxy compound or resin having two or more functional groups,
(B) a phenol compound or resin having two or more hydroxyl functional groups, 0 to 100 mol % of hydroxyl groups of which have been esterified by acyl groups, or an ester derivative thereof, and
(C) a phosphazenium compound represented by the above formula (1) as a curing accelerator as essential components.

Hereinafter, the phosphazenium compound represented by the formula (1) which is used in the present invention will be described.

In the formula (1), substituents $R^1$s each represent a hydrogen atom, a linear, branched or cyclic alkyl group having 1 to 10 carbon atoms or an aryl or aralkyl group having 6 to 10 carbon atoms and may be all the same or different from one another.

Illustrative examples of $R^1$ include a hydrogen atom; a linear, branched or cyclic alkyl group such as a methyl group, an ethyl group, an n-propyl group, an isopropyl group, an n-butyl group, an s-butyl group, a t-butyl group, a 1-pentyl group, a 2-pentyl group, a 3-pentyl group, a 2methyl-1-butyl group, an isopentyl group, a t-pentyl group, a 3-methyl-2-butyl group, a heopentyl group, an n-hexyl group, a 4-methyl-2-pentyl group, a cyclopentyl group, a cyclohexyl group, a 1-heptyl group, a 3-heptyl group, a 1octyl group, a 2-octyl group, a 2-ethyl-1-hexyl group, a nonyl group or a decyl group; an aryl group such as a phenyl group; and an aralkyl group such as a toluyl group, a benzyl group, a 1-phenylethyl group or a 2-phenylethyl group.

Of these, an aliphatic hydrocarbon group having 1 to 6 carbon atoms such as a methyl group, an ethyl group, an n-propyl group, an isopropyl group, an n-butyl group or a cyclohexyl group is preferable, and the methyl group and the ethyl group are more preferable.

In the formula (1), $Z^-$ represents a halogen anion, hydroxy anion, alkoxy anion, aryloxy anion or carboxy anion.

In addition, any anions can be used as long as they do not inhibit the effect of the present invention.

Illustrative examples of $Z^-$ include a halogen anion such as a fluorine anion, a chlorine anion, a bromine anion or an iodine anion; a hydroxy anion; an alkoxy anion derived from an alcohol such as methanol, ethanol, n-propanol, isopropanol, allyl alcohol, n-butanol, s-butanol, t-butanol, cyclohexanol, 2-heptanol, 1-octanol, 1-decanol or octahydronaphthol; an aryloxy anion derived from an aromatic hydroxy compound such as phenol, cresol, xylenol, naphthol, 2-methyl-1-naphthol or 9-phenanthrol; and a carboxy anion derived from a carboxylic acid such as formic acid, acetic acid, propionic acid, butyric acid, isobutyric acid, caproic acid, decanecarboxylic acid, oleic acid, benzoic acid or naphthoic acid.

Of these, the hydroxy anion; an alkoxy anion derived from an alcohol having 1 to 4 carbon atoms such as methanol, ethanol, n-propanol, isopropanol, n-butanol, s-butanol or t-butanol; an aryloxy anion derived from an aromatic hydroxy compound having 6 to 8 carbon atoms such as phenol or cresol; and a benzoyloxy anion derived from benzoic acid are preferable. More preferable are the hydroxy anion, a methoxy anion, a phenoxy anion and the benzoyloxy anion. The most preferable is the hydroxy anion.

These phosphazenium compounds may be used solely or in admixture of two or more.

These phosphazenium compounds can be synthesized in accordance with a method disclosed in Japanese Patent Application Laid-Open No. 77289/1998 or a similar method.

In the epoxy resin composition of the present invention, the curing accelerator (C) is used in an amount of 0.001 to 25 wt % (0.001 to 25 g/100 g), preferably 0.01 to 15 wt %, more preferably 0.1 to 8 wt %, based on 100 wt % of a resin component (total of the epoxy resin (A) and the curing agent (B)).

Further, in the epoxy resin composition of the present invention, together with the phosphazenium compound, a generally used, known accelerator other than the phosphazenium compound, such as imidazole, e.g., 2-methylimidazole or a phosphine, e.g., triphenylphosphine, may be used in an amount of 0.5 to 500 wt % of the phosphazenium compound. The characteristics of the present invention are exhibited readily when the amount is not higher than 500 wt % (five-fold equivalent).

The phosphazenium compound has almost no deliquescent properties. Even in the following preparation of the composition, it can be handled under a normal atmosphere as in the case of other compounds.

In the epoxy resin composition of the present invention, the epoxy resin as the component (A) is an epoxy resin having two or more epoxy groups in a molecule. As the epoxy resin (A), a variety of conventionally known epoxy resins can be used regardless of molecular structure, molecular weight and the like as long as they can be cured by a variety of curing agents as will be described later.

Firstly, preferable examples of the epoxy resin (A) include a novolac epoxy resin represented by the following formula (II), a phenol-dicyclopentadiene-type epoxy resin represented by the following formula (III), a phenol-aralkyl-resin-type epoxy resin represented by the following formula (IV), a naphthol-aralkyl-resin-type epoxy resin represented by the following formula (V), a biphenol-type-epoxy-containing epoxy resin represented by the following formula (VI) or a bisphenol-type-epoxy-containing epoxy resin represented by the following formula (VII):

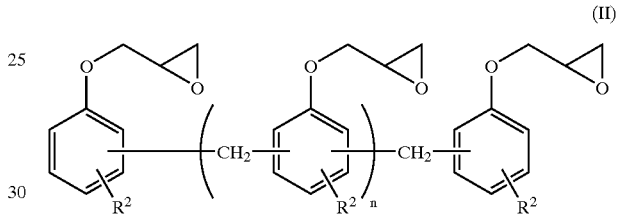

(II)

(wherein $R^2$s each represent a hydrogen atom, a methyl group or an ethyl group, and n which is the number of recurring units represents an integer of 0 to 50, its average being within a range of 0 to 15),

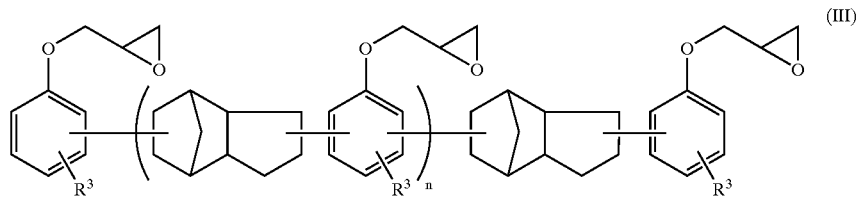

(III)

(wherein $R^3$s each represent a hydrogen atom, a halogen atom, a linear, branched or cyclic aliphatic alkyl group having 1 to 8 carbon atoms, an alkoxy group having 1 to 10 carbon atoms or a phenyl group, and n which is the number of recurring units represents an integer of 0 to 50, its average being within a range of 0 to 15),

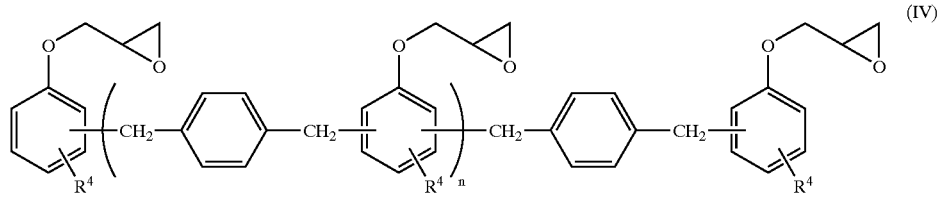

(IV)

(wherein $R^4$s each represent a hydrogen atom, a halogen atom, a linear, branched or cyclic aliphatic alkyl group having 1 to 8 carbon atoms, an alkoxy group having 1 to 10 carbon atoms or a phenyl group, and n which is the number of recurring units represents an integer of 0 to 50, its average being within a range of 0 to 15), 1 to 10 carbon atoms, an aryl group having 6 to 10 carbon atoms, an aryloxy group having 6 to 10 carbon atoms or halogen and may be all the same or different from one another, and Y represents an alkylidene having 1 to 10 carbon atoms, an alkylene having 2 to 10 carbon atoms, a cycloalkylidene having 3 to 10 carbon atoms, a cycloalkylene having 3 to 10 carbon atoms or a divalent group such as —O—, —CO—, —$CO_2$—, —S—, —SO— or —$SO_2$—).

As the epoxy resin (A), a variety of conventionally known epoxy resins can be used. For example, an epoxy resin synthesized from a variety of novolac resins including

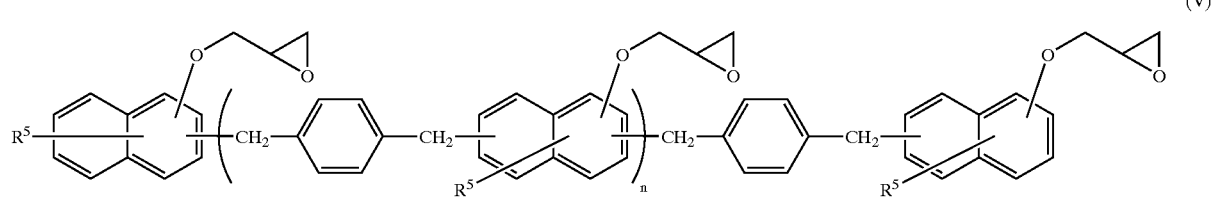

(V)

(wherein $R^5$s each represent a hydrogen atom, a halogen atom, a linear, branched or cyclic aliphatic alkyl group having 1 to 8 carbon atoms, an alkoxy group having 1 to 10 carbon atoms, a phenyl group or a glycidyl ether group, and n which is the number of recurring units represents an integer of 0 to 50, its average being within a range of 0 to 15),

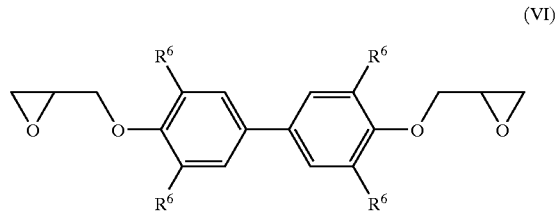

(VI)

(wherein $R^6$s each represent a hydrogen atom, a methyl group or an ethyl group and may be all the same or different from one another), and

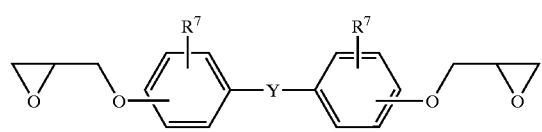

(VII)

(wherein $R^7$s each represent a hydrogen atom, an alkyl group having 1 to 10 carbon atoms, an alkoxyl group having epichlorohydrin and bisphenol, an alicyclic epoxy resin or an epoxy resin incorporating a halogen atom such as chlorine or bromine can be used. The above epoxy resins can be used solely or in admixture of two or more.

Preferable examples thereof include dihydroxybenzenes such as catechol, resorcin and hydroquinone, dihydroxynaphthalenes such as 1,4-dihydroxynaphthalene, 1,5-dihydroxynaphthalene, 1,6-dihydroxynaphthalene, 2,5-dihydroxynaphthalene and 2,6-dihydroxynaphthalene, epoxy resins obtained by epoxidating phenolic hydroxyl groups of a phenol novolac resin represented by the following formula (XIV):

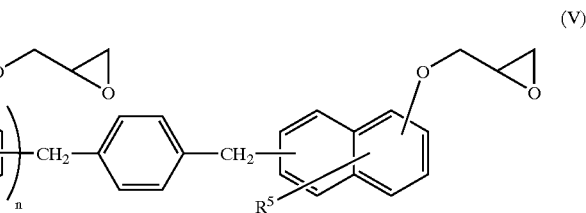

(XIV)

(wherein $R^{14}$s each represent a hydrogen atom, a methyl group or an ethyl group, and n which is the number of recurring units represents an integer of 0 to 50, its average being within a range of 0 to 15), a phenol-dicyclopentadiene resin represented by the following formula (XV):

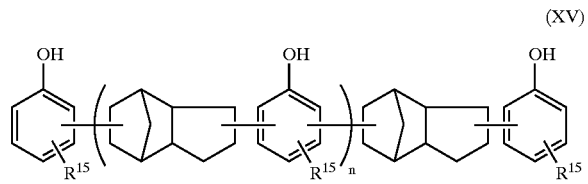
(XV)

(wherein $R^{15}$s each represent a hydrogen atom, a halogen atom, a linear, branched or cyclic aliphatic alkyl group having 1 to 8 carbon atoms, an alkoxy group having 1 to 10 carbon atoms or a phenyl group, and n which is the number of recurring units represents an integer of 0 to 50, its average being within a range of 0 to 15), a phenol aralkyl resin represented by a formula (XVI):

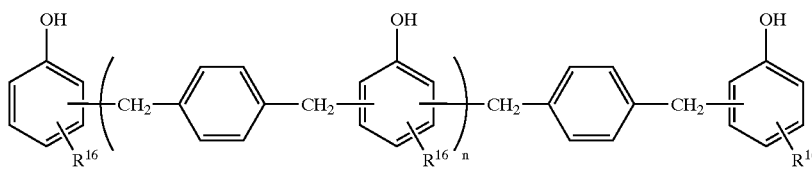
(XVI)

(wherein $R^{16}$s each represent a hydrogen atom, a halogen atom, a linear, branched or cyclic aliphatic alkyl group having 1 to 8 carbon atoms, an alkoxy group having 1 to 10 carbon atoms or a phenyl group, and n which is the number of recurring units represents an integer of 0 to 50, its average being within a range of 0 to 15), a naphthol aralkyl resin represented by a formula (XVII):

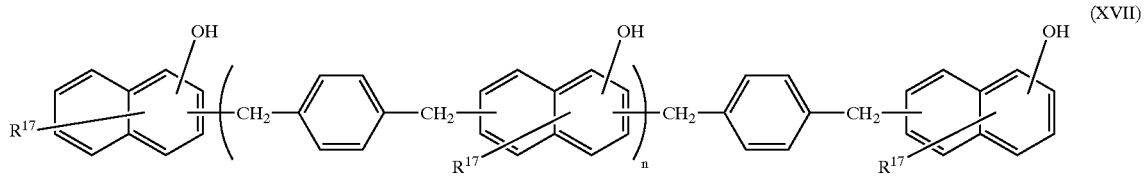
(XVII)

(wherein $R^{17}$s each represent a hydrogen atom, a halogen atom, a linear, branched or cyclic aliphatic alkyl group having 1 to 8 carbon atoms, an alkoxy group having 1 to 10 carbon atoms, a phenyl group or a hydroxyl group, and n which is the number of recurring units represents an integer of 0 to 50, its average being within a range of 0 to 15), a biphenol represented by the following formula (XVIII):

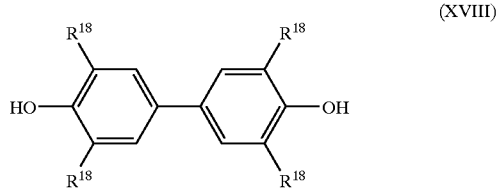
(XVIII)

(wherein $R^{18}$s each represent a hydrogen atom, a methyl group or an ethyl group and may be all the same or different from one another) and a bisphenol represented by a formula (XIX):

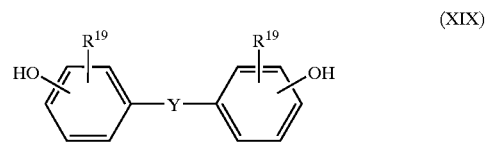
(XIX)

(wherein $R^{19}$s each represent a hydrogen atom, an alkyl group having 1 to 10 carbon atoms, an alkoxyl group having 1 to 10 carbon atoms, an aryl group having 6 to 10 carbon atoms, an aryloxy group having 6 to 10 carbon atoms or halogen and may be all the same or different from one another, and Y represents an alkylidene having 1 to 10 carbon atoms, an alkylene having 2 to 10 carbon atoms, a cycloalkylidene having 3 to 10 carbon atoms, a cycloalkylene having 3 to 10 carbon atoms or a divalent group such as —O—, —CO—, —CO$_2$—, —S—, —SO— or —SO$_2$—), epoxy resins obtained by epoxidating amino groups of aromatic polyamines such as 4,4'-diaminophenylmethane, 4,4'-diaminodiphenyl ether, 4,4'-diaminodiphenyl sulfone, 2,2'-bis(4,4'-diaminophenyl)propane, m-xylylenediamine, p-xylylenediamine and an aralkyl aniline resin represented by the following formula (XX):

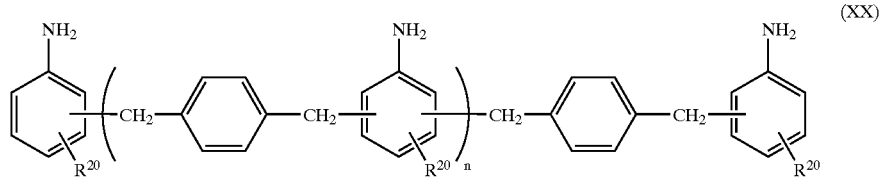

(XX)

(wherein $R^{20}$s each represent a hydrogen atom, a halogen atom, a linear, branched or cyclic aliphatic alkyl group having 1 to 8 carbon atoms, an alkoxy group having 1 to 10 carbon atoms or a phenyl group, and n which is the number of recurring-units represents an integer of 0 to 50, its average being within a range of 0 to 15), and epoxy compounds or resins derived from aminophenols such as m-aminophenol, p-aminophenol, 2-(4-aminophenyl)-2-(4'-hydroxyphenyl)propane and 4-aminophenyl-(4'-hydroxyphenyl)-methane.

More preferable of these are epoxy resins or compounds obtained by epoxidating a phenol novolac resin, a phenol dicyclopentadiene resin, a phenol aralkyl resin, a naphthol aralkyl resin, a biphenol and a bisphenol.

In the epoxy resin composition of the present invention, as the curing agent as the component (B), any phenolic-hydroxyl-group-containing compounds or resins 0 to 100 mol % of the hydroxyl groups of which have been esterified by acyl groups and ester derivatives thereof can be used.

Firstly, preferable examples of the curing agent (B) include a novolac resin represented by the following formula (VIII) or an ester derivative thereof, a phenol-dicyclopentadiene resin represented by the following formula (IX) or an ester derivative thereof, a phenol aralkyl resin represented by the following formula (X) or an ester derivative thereof, a naphthol aralkyl resin represented by the following formula (XI) or an ester derivative thereof, a biphenol compound represented by the following formula (XII) or an ester derivative thereof, or a bisphenol compound represented by the following formula (XIII) or an ester derivative thereof:

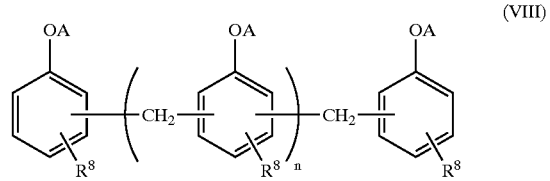

(VIII)

(wherein $R^8$s each represent a hydrogen atom, a methyl group or an ethyl group; n which is the number of recurring units represents an integer of 0 to 50, its average being within a range of 0 to 15; and A each represents a hydrogen atom in the case of the compound (B1) and an aromatic acyl group in the case of the compound (B2)),

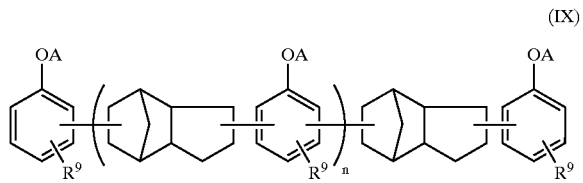

(IX)

(wherein $R^9$s each represent a hydrogen atom, a halogen atom, a linear, branched or cyclic aliphatic alkyl group having 1 to 8 carbon atoms, an alkoxy group having 1 to 10 carbon atoms or a phenyl group; n which is the number of recurring units represents an integer of 0 to 50, its average being within a range of 0 to 15; and each A represents a hydrogen atom in the case of the compound (B1) and an aromatic acyl group in the case of the compound (B2)),

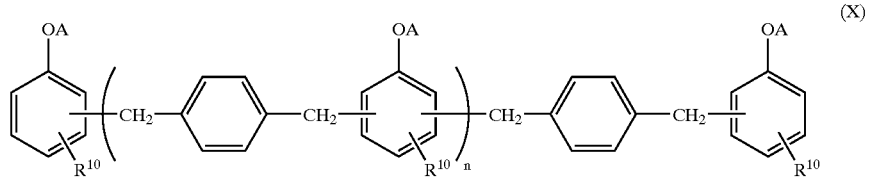

(X)

(wherein $R^{10}$s each represent a hydrogen atom, a halogen atom, a linear, branched or cyclic aliphatic alkyl group having 1 to 8 carbon atoms, an alkoxy group having 1 to 10 carbon atoms or a phenyl group; n which is the number of recurring units represents an integer of 0 to 50, its average being within a range of 0 to 15; and each A represents a hydrogen atom in the case of the compound (B1) and an aromatic acyl group in the case of the compound (B2)), 3 to 10 carbon atoms or a divalent group such as —O—, —CO—, —CO$_2$—, —S—, —SO— or —SO$_2$—; and each A represents a hydrogen atom in the case of the compound (B1) and an aromatic acyl group in the case of the compound (B2)).

Particularly preferable examples of the curing agent (B) include:

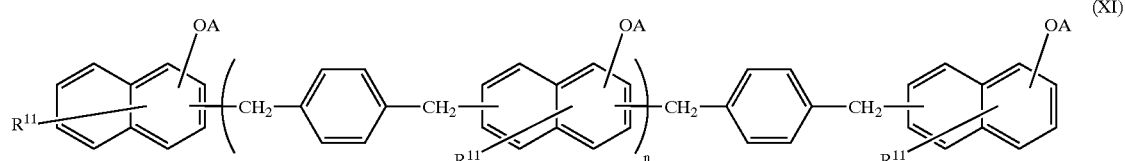

(XI)

(wherein $R^{11}$s each represent a hydrogen atom, a halogen atom, a linear, branched or cyclic aliphatic alkyl group having 1 to 8 carbon atoms, an alkoxy group having 1 to 10 carbon atoms or a phenyl group; n which is the number of recurring units represents an integer of 0 to 50, its average being within a range of 0 to 15; and each A represents a hydrogen atom in the case of the compound (B1) and an aromatic acyl group in the case of the compound (B2)),

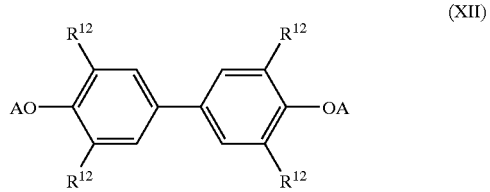

(XII)

(wherein $R^{12}$s each represent a hydrogen atom, a methyl group or an ethyl group and may be all the same or different from one another; and each A represents a hydrogen atom in the case of the compound (B1) and an aromatic acyl group in the case of the compound (B2)), and

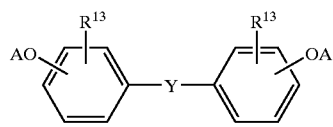

(XIII)

(wherein $R^{13}$s each represent a hydrogen atom, an alkyl group having 1 to 10 carbon atoms, an alkoxyl group having 1 to 10 carbon atoms, an aryl group having 6 to 10 carbon atoms, an aryloxy group having 6 to 10 carbon atoms or halogen and may be all the same or different from one another; Y represents an alkylidene having 1 to 10 carbon atoms, an alkylene having 2 to 10 carbon atoms, a cycloalkylidene having 3 to 10 carbon atoms, a cycloalkylene having a phenol novolac resin represented by the following formula (XIV):

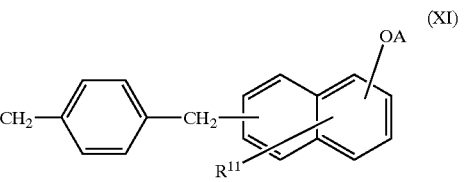

(XIV)

(wherein $R^{14}$s each represent a hydrogen atom, a methyl group or an ethyl group, and n which is the number of recurring units represents an integer of 0 to 50, its average being within a range of 0 to 15), a phenol-dicyclopentadiene resin represented by the following formula (XV):

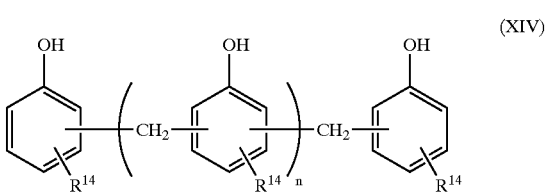

(XV)

(wherein $R^{15}$s each represent a hydrogen atom, a halogen atom, a linear, branched or cyclic aliphatic alkyl group having 1 to 8 carbon atoms, an alkoxy group having 1 to 10 carbon atoms or a phenyl group, and n which is the number of recurring units represents an integer of 0 to 50, its average being within a range of 0 to 15), a phenol aralkyl resin represented by the following formula (XVI):

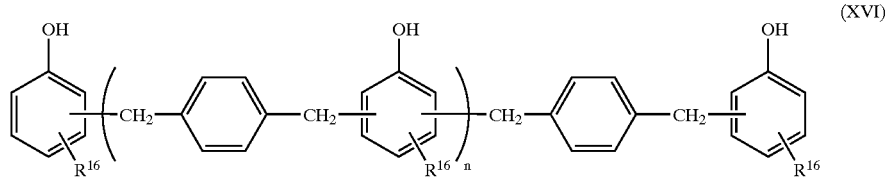

(XVI)

(wherein $R^{16}$s each represent a hydrogen atom, a halogen atom, a linear, branched or cyclic aliphatic alkyl group having 1 to 8 carbon atoms, an alkoxy group having 1 to 10 carbon atoms or a phenyl group, and n which is the number of recurring units represents an integer of 0 to 50, its average being within a range of 0 to 15), a naphthol aralkyl resin represented by the following formula (XVII):

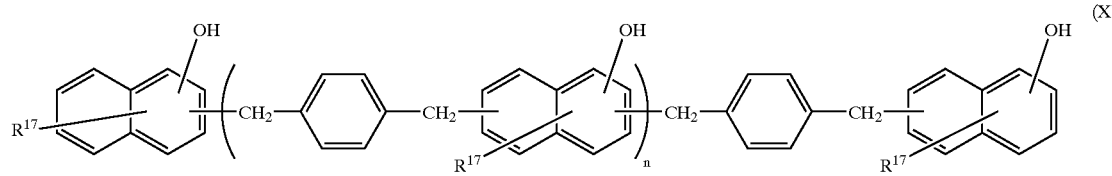

(XVII)

(wherein $R^{17}$s each represent a hydrogen atom, a halogen atom, a linear, branched or cyclic aliphatic alkyl group having 1 to 8 carbon atoms, an alkoxy group having 1 to 10 carbon atoms, a phenyl group or a hydroxyl group, and n which is the number of recurring units represents an integer of 0 to 50, its average being within a range of 0 to 15), a biphenol represented by the following formula (XVIII):

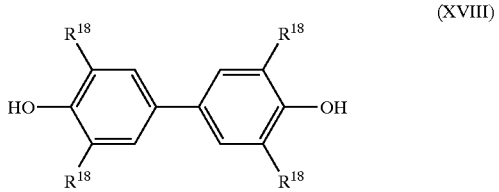

(XVIII)

(wherein $R^{18}$s each represent a hydrogen atom, a methyl group or an ethyl group and may be all the same or different from one another), and a bisphenol represented by the following formula (XIX):

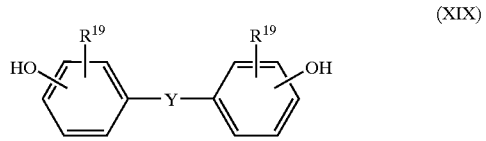

(XIX)

(wherein $R^{19}$s each represent a hydrogen atom, an alkyl group having 1 to 10 carbon atoms, an alkoxyl group having 1 to 10 carbon atoms, an aryl group having 6 to 10 carbon atoms, an aryloxy group having 6 to 10 carbon atoms or halogen and may be all the same or different from one another, and Y represents an alkylidene having 1 to 10 carbon atoms, an alkylene having 2 to 10 carbon atoms, a cycloalkylidene having 3 to 10 carbon atoms, a cycloalkylene having 3 to 10 carbon atoms or a divalent group such as —O—, —CO—, —$CO_2$—, —S—, —SO— or —$SO_2$—).

Esterification of these phenol resins can be performed in accordance with a known method. Further, an esterifying agent used to esterify the above hydroxyl groups may be any of an organic carboxylic anhydride, an organic carboxylic halide and an organic carboxylic acid. A convenient esterifying agent may be selected according to characteristics of an esterifying agent based on the number of carbon atoms of an ester desired to be derived.

Specific examples of the esterifying agent include acetic anhydride, acetyl chloride, acetyl bromide, acetic acid, propionic anhydride, propionyl chloride, propionyl bromide, propionic acid, butyric anhydride, butyric chloride, butyric acid, valeric anhydride, valeric chloride, valeric bromide, valeric acid, pivalic chloride, pivalic acid, phenylacetic acid, phenyl acetyl chloride, 2-phenylpropionic acid, 3-phenylpropionic acid, o-tolylacetic acid, m-tolylacetic acid, p-tolylacetic acid, cumenic acid, benzoic anhydride, benzoic chloride, benzoic bromide, benzoic acid, o-methylbenzoic chloride, m-methylbenzoic chloride, p-methylbenzoic chloride, o-methylbenzoic acid, m-methylbenzoic acid, p-methylbenzoic acid, dimethylbenzoic acid, and naphthoic acid.

These esterifying agents can be used solely or in admixture of two or more.

Further, in the present invention, the rate of esterification is 0 to 100 mol %, preferably 10 to 100 mol %, more preferably 50 to 100 mol %, much more preferably 80 to 100 mol %, most preferably 90 to 100 mol %.

In this regard, an esterification rate of 0% simply implies a phenol compound or a phenol resin.

In the epoxy resin composition of the present invention, a phenol compound or phenol resin or an ester derivative thereof is used as the curing agent for an epoxy resin having two or more functional groups. Since the epoxy resin composition of the present invention is intended for use as a thermosetting resin in the same applications as a conventional epoxy-phenol cured product is used, such a combination of the constituents that the composition can take a three-dimensional structure after cured is desirable.

As for the mixing ratio of the epoxy resin (A) and the curing agent (B), a total of hydroxyl groups and ester groups, that is, active groups, is 0.5 to 1.5 mole equivalents, preferably 0.7 to 1.3 mole equivalents, based on 1 mole equivalent of epoxy groups. In actual use, it is more preferable to adjust and use a molar ratio with which optimum physical properties of a cured product can be obtained.

To prepare the epoxy resin composition of the present invention, any techniques may be used. For example, it is possible that the phosphazenium compound of the formula (1) as the accelerator is melt-mixed into the curing agent sufficiently in advance and the mixture is then mixed with the epoxy resin or these may be mixed together simultaneously.

Further, to fully homogenize these materials, they may be dry-blended in powdery form.

In the epoxy resin composition of the present invention, as required, an organic and/or inorganic filler(s) as a component (D) and other additives may be added to the epoxy resin composition.

Particularly, when the epoxy resin composition of the present invention is used as a sealant for a semiconductor integrated circuit, it is desirable to use the organic and/or inorganic filler(s) (D) and a variety of additives such as a colorant, e.g. carbon black, a mold releasing agent, a coupling agent and a flame retardant for the purposes of improving its mechanical properties and reducing an overall cost.

The amount of the organic and/or inorganic filler(s) (D) is preferably 100 parts by weight to 1,900 parts by weight based on 100 parts by weight of a total of the epoxy resin (A) and the curing agent (B). From the viewpoints of moisture resistance and mechanical strength, the amount is more preferably not smaller than 250 parts by weight, particularly preferably not smaller 550 parts by weight.

Illustrative examples of the organic and/or inorganic filler(s) (D) include powders such as silica, alumina, silicon nitride, silicon carbide, talc, calcium silicate, calcium carbonate, mica, clay and titanium white, and fibers such as glass fibers, carbon fibers and aramid fibers. Of these, crystalline silica and/or fused silica are/is preferably used in the sealant. Further, in consideration of flowability of the resin composition at the time of molding, the silicas desirably have spherical shapes or a combination of spherical shapes and irregular shapes.

Further, in the epoxy resin composition of the present invention, in consideration of mechanical strength and heat resistance, it is desirable to use a coupling agent to improve adhesion between the resin and the filler. Illustrative examples of the coupling agent include a silane coupling agent, a titanate coupling agent, an aluminate coupling agent and a zircoaluminate coupling agent. Of these, the silane coupling agent is preferable, and particularly, a silane coupling agent having a functional group which reacts with an epoxy group is the most preferable.

Specific examples of such a coupling agent include vinyl trimethoxysilane, vinyl triethoxysilane, N-(2-aminomethyl)-3-aminopropylmethyldimethoxysilane, N-(2-amino-ethyl)-3-aminopropyltrimethoxysilane, 3-aminopropyltriethoxysilane, 3-anilinopropyltriethoxysilane, 3-glycidoxy-propyltrimethoxysilane, 3-glycidoxypropylmethyldimethoxysilane, 2-(3,4-epoxycyclohexyl)ethyltrimethoxysilane, 3-methacryloxypropyltrimethoxysilane, and 3-mercaptopropyltrimethoxysilane. These can be used solely or in combination of two or more.

It is desirable that these coupling agents be adsorbed to the surface of the filler or solidified by a reaction in advance.

As a method for producing a semiconductor device by sealing a semiconductor integrated circuit by use of the epoxy resin composition of the present invention, low pressure transfer molding can be said to be the most commonly used. However, other methods such as injection molding, compression molding and cast molding can also be used, and a special technique using a solvent can also be used.

Hereinafter, the present invention will be described in detail with reference to Examples. However, the present invention shall not be limited by the Examples in any way.

SYNTHETIC EXAMPLE 1

To a glass container equipped with a thermometer, an agitator, a dropping funnel and a reflux condenser, 312 g (3 mol) of phenol novolac resin (trade name: BRG#558, product of SHOWA HIGHPOLYMER, hydroxyl group equivalent: 104 g/eq) was added, and the internal temperature of the container was raised to 125° C. With the internal temperature kept at the above temperature, 336.9 g (3.3 mol) of acetic anhydride was added dropwise in two hours under agitation. Thereafter, with the internal temperature kept at 125° C., the reaction was carried out for 2 hours, and then the temperature was raised to 140° C. At 140 to 150° C., the mixture was aged for 2 hours, and then excessive acetic anhydride and by-produced acetic acid were distilled off under a reduced pressure at 150° C./10 mmHg at the highest.

The obtained resin was dissolved in 1,400 g of toluene and then washed with hot water at 60 to 70° C. until waste water becomes neutral, and toluene was distilled off at 150° C./5 mmHg at the highest so as to obtain 370 g of phenol novolac resin having completely acetylated hydroxyl groups. Its hydroxyl group equivalent was not smaller than 3,000 g/eq (undetectable).

SYNTHESIS EXAMPLE 2

To a glass container equipped with a thermometer, an agitator, a dropping funnel and a reflux condenser, 312 g (3 mol) of phenol novolac resin (trade name: BRG#558, product of SHOWA HIGHPOLYMER, hydroxyl group equivalent: 104 g/eq) was added, and the internal temperature of the container was raised to 125° C. With the internal temperature kept at the above temperature, 421.7 g (3 mol) of benzoyl chloride was added dropwise in two hours under agitation. A hydrogen chloride gas produced during the reaction was absorbed into a trap. Thereafter, with the internal temperature kept at 125° C., the reaction was carried out for 2 hours, and then the temperature was raised to 140° C. At 140 to 150° C., the mixture was aged for 2 hours, and then hydrochloric acid was removed under a slightly reduced pressure.

The obtained resin was dissolved in 1,400 g of toluene and then washed with hot water at 60 to 70° C. until waste water becomes neutral, and toluene was distilled off at 150° C./5 mmHg at the highest so as to obtain 590 g of phenol novolac resin having completely benzoylated hydroxyl groups. Its hydroxyl group equivalent was not smaller than 3,000 g/eq (undetectable).

SYNTHETIC EXAMPLE 3

To a glass container equipped with a thermometer, an agitator, a dropping funnel and a reflux condenser, 507 g (3 mol) of phenol aralkyl resin (trade name: MIREX XLC-4L, hydroxyl group equivalent: 169 g/eq, product of Mitsui Chemicals, Inc.) was added, and the internal temperature of the container was raised to 125° C. With the internal temperature kept at the above temperature, 336.9 g (3.3 mol) of acetic anhydride was added dropwise in two hours under agitation. Thereafter, with the internal temperature kept at 125° C., the reaction was carried out for 2 hours, and then the temperature was raised to 140° C. At 140 to 150° C., the mixture was aged for 2 hours, and then excessive acetic anhydride and by-produced acetic acid were distilled off under a reduced pressure at 150° C./10 mmHg at the highest.

The obtained resin was dissolved in 1,400 g of toluene and then washed with hot water at 60 to 70° C. until waste water becomes neutral, and toluene was distilled off at 150° C./5 mmHg at the highest so as to obtain 609 g of phenol aralkyl resin having completely acetylated hydroxyl groups. Its hydroxyl group equivalent was not smaller than 3,000 g/eq (undetectable).

SYNTHESIS EXAMPLE 4

To a glass container equipped with a thermometer, an agitator, a dropping funnel and a reflux condenser, 507 g (3 mol) of phenol aralkyl resin (trade name: MIREX XLC-4L, hydroxyl group equivalent: 169 g/eq, product of Mitsui Chemicals, Inc.) was added, and the internal temperature of the container was raised to 125° C. With the internal temperature kept at the above temperature, 421.7 g (3 mol) of benzoyl chloride was added dropwise in two hours under agitation. A hydrogen chloride gas produced during the reaction was absorbed into a trap. Thereafter, with the internal temperature kept at 125° C., the reaction was carried out for 2 hours, and then the temperature was raised to 140° C. At 140 to 150° C., the mixture was aged for 2 hours, and then hydrochloric acid was removed under a slightly reduced pressure.

The obtained resin was dissolved in 1,400 g of toluene and then washed with hot water at 60 to 70° C. until waste water becomes neutral, and toluene was distilled off at 150° C./5 mmHg at the highest so as to obtain 785 g of phenol aralkyl resin having completely benzoylated hydroxyl groups. Its hydroxyl group equivalent was not smaller than 3,000 g/eq (undetectable).

SYNTHETIC EXAMPLE 5

To a glass container equipped with a thermometer, an agitator, a dropping funnel and a reflux condenser, 540 g (3 mol) of phenol-dicyclopentadiene resin (trade name: DPR-5000, product of Mitsui Chemicals, Inc., hydroxyl group equivalent: 180 g/eq) was added, and the internal temperature of the container was raised to 125° C. With the internal temperature kept at the above temperature, 336.9 g (3.3 mol) of acetic anhydride was added dropwise in two hours under agitation. Thereafter, with the internal temperature kept at 125° C., the reaction was carried out for 2 hours, and then the temperature was raised to 140° C. At 140 to 150° C., the mixture was aged for 2 hours, and then excessive acetic anhydride and by-produced acetic acid were distilled off under a reduced pressure at 150° C./10 mmHg at the highest.

The obtained resin was dissolved in 1,400 g of toluene and then washed with hot water at 60 to 70° C. until waste water becomes neutral, and toluene was distilled off at 150° C./5 mmHg at the highest so as to obtain 610 g of phenol-dicyclopentadiene-resin-type resin having completely acetylated hydroxyl groups. Its hydroxyl group equivalent was not smaller than 3,000 g/eq (undetectable).

SYNTHESIS EXAMPLE 6

To a glass container equipped with a thermometer, an agitator, a dropping funnel and a reflux condenser, 540 g (3 mol) of phenol-dicyclopentadiene resin (trade name: DPR-5000, product of Mitsui Chemicals, Inc., hydroxyl group equivalent: 180 g/eq) was added, and the internal temperature of the container was raised to 125° C. With the internal temperature kept at the above temperature, 421.7 g (3 mol) of benzoyl chloride was added dropwise in two hours under agitation. A hydrogen chloride gas produced during the reaction was absorbed into a trap. Thereafter, with the internal temperature kept at 125° C., the reaction was carried out for 2 hours, and then the temperature was raised to 140° C. At 140 to 150° C., the mixture was aged for 2 hours, and then hydrochloric acid was removed under a slightly reduced pressure.

The obtained resin was dissolved in 1,400 g of toluene and then washed with hot water at 60 to 70° C. until waste water becomes neutral, and toluene was distilled off at 150° C./5 mmHg at the highest so as to obtain 810 g of phenol-dicyclopentadiene-resin-type resin having completely benzoylated hydroxyl groups. Its hydroxyl group equivalent was not smaller than 3,000 g/eq (undetectable).

SYNTHETIC EXAMPLE 7

To a glass container equipped with a thermometer, an agitator, a dropping funnel and a reflux condenser, 654 g (3 mol) of naphthol aralkyl resin (trade name: α-NX-3.2, product of Mitsui Chemicals, Inc., hydroxyl group equivalent: 218 g/eq) was added, and the internal temperature of the container was raised to 125° C. With the internal temperature kept at the above temperature, 336.9 g (3.3 mol) of acetic anhydride was added dropwise in two hours under agitation. Thereafter, with the internal temperature kept at 125° C., the reaction was carried out for 2 hours, and then the temperature was raised to 140° C. At 140 to 150° C., the mixture was aged for 2 hours, and then excessive acetic anhydride and by-produced acetic acid were distilled off under a reduced pressure at 150° C./10 mmHg at the highest.

The obtained resin was dissolved in 1,400 g of toluene and then washed with hot water at 60 to 70° C. until waste water becomes neutral, and toluene was distilled off at 150° C./5 mmHg at the highest so as to obtain 745 g of naphthol aralkyl resin having completely acetylated hydroxyl groups. Its hydroxyl group equivalent was not smaller than 3,000 g/eq (undetectable).

SYNTHESIS EXAMPLE 8

To a glass container equipped with a thermometer, an agitator, a dropping funnel and a reflux condenser, 654 g (3 mol) of naphthol aralkyl resin (trade name: α-NX-3.2, product of Mitsui Chemicals, Inc., hydroxyl group equivalent: 218 g/eq) was added, and the internal temperature of the container was raised to 125° C. With the internal temperature kept at the above temperature, 421.7 g (3 mol) of benzoyl chloride was added dropwise in two hours under agitation. A hydrogen chloride gas produced during the reaction was absorbed into a trap. Thereafter, with the internal temperature kept at 125° C., the reaction was carried out for 2 hours, and then the temperature was raised to 140° C. At 140 to 150° C., the mixture was aged for 2 hours, and then hydrochloric acid was removed under a slightly reduced pressure.

The obtained resin was dissolved in 1,400 g of toluene and then washed with hot water at 60 to 70° C. until waste water becomes neutral, and toluene was distilled off at 150° C./5 mmHg at the highest so as to obtain 923 g of naphthol aralkyl resin having completely benzoylated hydroxyl groups. Its hydroxyl group equivalent was not smaller than 3,000 g/eq (undetectable).

SYNTHESIS EXAMPLE 9

588 g of phenol novolac resin having 88% of its hydroxyl groups benzoylated was obtained in the same manner as in Synthesis Example 2 except that the amount of benzoyl chloride was changed to 371.2 g (2.64 mol). Its hydroxyl group equivalent was 958 g/eq.

EXAMPLE 1

1 gram equivalent of o-cresol novolac (trade name: EOCN102S-65, product of NIPPON KAYAKU CO., LTD., epoxy equivalent: 210 g/eq) as an epoxy resin and 1 gram equivalent of the acetylated phenol novolac resin (ester equivalent: 146 g/eq=calculated value) of Synthesis Example 1 as a curing agent were fully melt-mixed with each other at 100° C. so as to obtain a homogeneous resin mixture.

To the resin mixture, 0.0055 mol of phosphazenium compound of the foregoing formula (1) wherein $R^1$ was a methyl group was added as a curing accelerator, and the resulting mixture was mixed at 120° C. for 1 minute so as to obtain a resin composition.

To 200 g of the resin composition, a filler and other additives were added in the following amounts, and the mixture was roll-mixed under heating so as to obtain a molding material for a sealant:

Inorganic Filler [Spherical Fused Silica (YXK-35R, product of TATSUMORI CO., LTD.)]: 1,440 g
Silane Coupling Agent (SZ-6083, product of Dow Corning Toray Silicone Co., Ltd.): 124 g
Carnauba Wax: 90 g
Carbon Black: 6 g
Antimony Oxide: 20 g Using a portion of the molding material, a cured product was obtained under conditions of 175° C./10 min and 150 kg/cm$^2$ and then after-cured at 175° C./8 hr (nitrogen atmosphere) so as to fully cure the product. Physical properties were measured by use of the cured product.

Further, by use of the same molding material, test semiconductor devices were prepared by low pressure transfer molding, and a cracking test was conducted by means of a solder bath.

EXAMPLE 2

Tests were conducted in the same manner as in Example 1 except that the curing agent was changed to the benzoylated phenol novolac resin of Synthesis Example 2.

EXAMPLE 3

Tests were conducted in the same manner as in Example 1 except that the epoxy compound was changed to YX4000H, the curing agent was changed to the acetylated phenol aralkyl resin of Synthesis Example 3, and a composition was obtained by a method comprising the steps of fully melt-mixing the curing agent with the accelerator at 120° C. in advance and then adding the epoxy resin.

EXAMPLE 4

Tests were conducted in the same manner as in Example 3 except that the curing agent was changed to the benzoylated phenol aralkyl resin of Synthesis Example 4.

EXAMPLE 5

Tests were conducted in the same manner as in Example 1 except that the curing agent was changed to the acetylated phenol-dicyclopentadiene resin of Synthesis Example 5.

EXAMPLE 6

Tests were conducted in the same manner as in Example 1 except that the curing agent was changed to the benzoylated phenol-dicyclopentadiene resin of Synthesis Example 6.

EXAMPLE 7

Tests were conducted in the same manner as in Example 3 except that the curing agent was changed to the acetylated naphthol aralkyl resin of Synthesis Example 7.

EXAMPLE 8

Tests were conducted in the same manner as in Example 3 except that the curing agent was changed to the benzoylated naphthol aralkyl resin of Synthesis Example 8.

COMPARATIVE EXAMPLE 1

A resin composition was prepared in the same manner as in Example 1 except that the accelerator was changed to 0.015 mol of triphenylphosphine. However, a cured product was not obtained. Further, although gelation time was also measured at 150° C. and 200° C. for 20 minutes, the test was stopped since no gelation was seen.

COMPARATIVE EXAMPLE 2

A resin composition was prepared in the same manner as in Example 2 except that the accelerator was changed to 0.015 mol of triphenylphosphine. However, a cured product was not obtained. Further, although gelation time was also measured at 150° C. and 200° C. for 20 minutes, the test was stopped since no gelation was seen.

COMPARATIVE EXAMPLE 3

Tests were conducted in the same manner as in Comparative Example 1 except that the curing agent was changed to a phenol novolac resin (trade name: BRG#558, product of SHOWA HIGHPOLYMER, hydroxyl group equivalent: 104 g/eq).

COMPARATIVE EXAMPLE 4

Tests were conducted in the same manner as in Comparative Example 1 except that the curing agent was changed to a phenol-dicyclopentadiene-resin-type resin (trade name: DPR-5000, product of Mitsui Chemicals, Inc., hydroxyl group equivalent: 180 g/eq).

COMPARATIVE EXAMPLE 5

Tests were conducted in the same manner as in Example 3 except that the accelerator was changed to 0.015 mol of triphenylphosphine and the curing agent was changed to a phenol aralkyl resin (trade name: MIREX XLC-4L, hydroxyl group equivalent: 169 g/eq, product of Mitsui Chemicals, Inc.).

EXAMPLE 9

Tests were conducted in the same manner as in Example 3 except that the curing agent was changed to the phenol novolac resin of Synthesis Example 9 having 88% of its hydroxyl groups benzoylated.

EXAMPLE 10

Tests were conducted in the same manner as in Example 3 except that the curing agent was changed to a mixture of the benzoylated phenol novolac resin of Synthesis Example 2 and a phenol novolac resin (trade name: BRG#558, product of SHOWA HIGHPOLYMER, hydroxyl group equivalent: 104 g/eq) at a mixing ratio of 88:12 (ratio of functional groups).

COMPARATIVE EXAMPLE 6

A resin composition was prepared in the same manner as in Example 9 except that the accelerator was changed to 0.015 mol of triphenylphosphine. However, a cured product was not obtained.

COMPARATIVE EXAMPLE 7

A resin composition was prepared in the same manner as in Example 10 except that the accelerator was changed to 0.015 mol of triphenylphosphine. However, a cured product was not obtained.

(Evaluation Results)

The results of the foregoing Examples and Comparative Examples are shown in Tables 1 to 4. Gelation times of the resin compositions prior to the roll mixing were measured at 150° C. Further, physical properties were measured in accordance with the following testing methods.

Tg (Glass Transition Temperature): This was measured in accordance with a TMA needle penetration method (Shimadzu TMA-DRW DT-30).

Post-Boiling Water Absorption: An increase in weight after boiled in boiling water of 100° C. for 2 hours was measured.

V.P.S Test: Test semiconductor devices were molded and left to stand in a bath kept at a constant temperature of 85° C. and a constant humidity of 85% for 168 hours. Immediately after that, the devices were put in a Fluorinert™ liquid (product of Sumitomo 3M, FC-70) of 240° C. The number of semiconductors whose package resins were cracked was counted. The test value was expressed in the form of a fraction, with a numerator representing the number of cracked semiconductors and n=5.

TABLE 1

|  | Ex. 1 | Ex. 2 | Ex. 3 | Ex. 4 | Ex. 5 |
|---|---|---|---|---|---|
| Glass Transition Temperature (° C.) | 153 | 148 | 108 | 99 | 129 |
| Post-Boiling Water Absorption (%) | 0.09 | 0.16 | 0.09 | 0.08 | 0.08 |
| V.P.S Test (Rate of Occurrence of Cracks (%)) | 0 | 0 | 0 | 0 | 0 |
| Gelation Time (min' sec") | 4'41" | 5'25" | 5'22" | 5'52" | 4'59" |

TABLE 2

|  | Ex. 6 | Ex. 7 | Ex. 8 | Ex. 9 | Ex. 10 |
|---|---|---|---|---|---|
| Glass Transition Temperature (° C.) | 119 | 111 | 105 | 116 | 116 |
| Post-Boiling Water Absorption (%) | 0.10 | 0.11 | 0.06 | 0.10 | 0.10 |
| V.P.S Test (Rate of Occurrence of Cracks (%)) | 0 | 0 | 0 | 0 | 0 |
| Gelation Time (min' sec") | 5'56" | 5'42" | 5'30" | 5'35" | 5'31" |

TABLE 3

|  | Comp. Ex. 1 | Comp. Ex. 2 | Comp. Ex. 3 | Comp. Ex. 4 | Comp. Ex. 5 |
|---|---|---|---|---|---|
| Glass Transition Temperature (° C.) | — | — | 173 | 141 | 100 |
| Post-Boiling Water Absorption (%) | — | — | 0.21 | 0.15 | 0.12 |
| V.P.S Test (Rate of Occurrence of Cracks (%)) | — | — | 3 | 2 | 1 |
| Gelation Time (min' sec") | Not Cured | Not Cured | 3'38" | 4'41" | 4.37" |

TABLE 4

|  | Comp. Ex. 6 | Comp. Ex. 7 |
|---|---|---|
| Glass Transition Temperature (° C.) | — | — |
| Post-Boiling Water Absorption (%) | — | — |
| V.P.S Test (Rate of Occurrence of Cracks (%)) | — | — |
| Gelation Time (min' sec") | Not Cured | Not Cured |

With reference to the foregoing Examples, curing of the esterified phenol resins and the epoxy resins has been described in detail. An epoxy resin composition containing the accelerator and phosphazenium compound of the present invention as essential components and a compound whose hydroxyl groups have been esterified by acyl groups as a curing agent has far superior hygroscopicity and is very advantageous in terms of cracking resistance as compared with a conventional epoxy resin/phenol resin cured product. It is thereby understood that the epoxy resin compound is excellent in cracking resistance as a sealant.

Further, it is realized that when triphenylphosphine (TPP) which is a conventional accelerator is used, triphenylphosphine does not cause a curing reaction in portions esterified by acryl groups, as shown by Comparative Examples 1 and 2. From this fact, it is understood that the esterified curing agent and the phosphazenium compound are essential components so as to obtain high physical properties as the sealant in the present invention.

EXAMPLE 11

1 gram equivalent of o-cresol novolac (trade name: EOCN102S-65, product of NIPPON KAYAKU CO., LTD., epoxy equivalent: 210 g/eq) as an epoxy resin and 1 gram equivalent of phenol novolac resin (trade name: BRG#558, product of SHOWA HIGHPOLYMER, hydroxyl group equivalent: 104 g/eq) as a curing agent were fully melt-mixed with each other at 100° C. so as to obtain a homogeneous resin mixture.

To the resin mixture, 0.0055 mol of phosphazenium compound of the foregoing formula (1) wherein all Rs were a methyl group and $Z^-$ was a hydroxy anion was added as a curing accelerator, and the resulting mixture was mixed at 80° C. for 1 minute so as to obtain a resin composition.

To 200 g of the resin composition, a filler and other additives were added in the following amounts, and the mixture was roll-mixed under heating so as to obtain a molding material for a sealant:

Inorganic Filler [Spherical Fused Silica (YXK-35R, product of TATSUMORI CO., LTD.)]: 1,440 g Silane Coupling Agent (SZ-6083, product of Dow Corning Toray Silicone Co., Ltd.): 124 g Carnauba Wax: 90 g Carbon Black: 6 g Antimony Oxide: 20 g Using a portion of the molding material, a cured product was obtained under conditions of 150° C.→185° C./5 min, 185° C./5 min and 150 kg/cm² and then after-cured at 185° C./8 hr (nitrogen atmosphere) so as to fully cure the product. Tests were conducted with respect to curing behavior and the like.

EXAMPLE 12

Tests were conducted in the same manner as in Example 11 except that the curing agent was changed to a phenoldicyclopentadiene resin (trade name: DPR-5000, product of Mitsui Chemicals, Inc., hydroxyl group equivalent: 180 g/eq).

EXAMPLE 13

Tests were conducted in the same manner as in Example 12 except that the epoxy resin was changed to tetramethylbiphenoldiglycidyl ether (trade name: YX4000H, product of JER CO., LTD., epoxy equivalent: 184 g/eq).

EXAMPLE 14

Tests were conducted in the same manner as in Example 13 except that the curing agent was changed to a naphthol aralkyl resin (trade name: α-NX-3.2, product of Mitsui Chemicals, Inc., hydroxyl group equivalent: 218 g/eq).

EXAMPLE 15

Tests were conducted in the same manner as in Example 14 except that the curing agent was changed to a phenol aralkyl resin (trade name: MIREX XLC-4L, hydroxyl group equivalent: 169 g/eq, product of Mitsui Chemicals, Inc.).

EXAMPLE 16

Tests were conducted in the same manner as in Example 11 except that the epoxy resin was changed to a phenol-dicyclopentadiene-resin-type epoxy resin (trade name: EPICHRON HP-7200, product of DAINIPPON INK AND CHEMICALS, INC., epoxy equivalent: 262 g/eq).

EXAMPLE 17

Tests were conducted in the same manner as in Example 16 except that the curing agent was changed to a phenol aralkyl resin (trade name: MIREX XLC-4L, hydroxyl group equivalent: 169 g/eq, product of Mitsui Chemicals, Inc.).

EXAMPLE 18

Tests were conducted in the same manner as in Example 17 except that the epoxy resin was changed to a phenol-aralkyl-resin-type epoxy resin: MIREX XLC-4L (product of Mitsui Chemicals, Inc., hydroxyl group equivalent: 169 g/eq) epoxidated in accordance with a conventional method.

EXAMPLE 19

Tests were conducted in the same manner as in Example 11 except that the epoxy resin was changed to a dihydroxynaphthalenediglycidyl ether (trade name: EPICHRON HP4032, product of DAINIPPON INK AND CHEMICALS, INC., 150 g/eq).

EXAMPLE 20

Tests were conducted in the same manner as in Example 19 except that the epoxy resin was changed to bisphenol-A-type diglycidyl ether (trade name: EPICOAT 828, product of JER CO., LTD., epoxy equivalent: 184 g/eq).

COMPARATIVE EXAMPLE 8

Tests were conducted in the same manner as in Example 11 except that the accelerator was changed to 0.008 mol of triphenylphosphine (TPP).

COMPARATIVE EXAMPLE 9

Tests were conducted in the same manner as in Example 12 except that the accelerator was changed to 0.008 mol of triphenylphosphine (TPP).

COMPARATIVE EXAMPLE 10

Tests were conducted in the same manner as in Example 13 except that the accelerator was changed to 0.015 mol of triphenylphosphine (TPP).

COMPARATIVE EXAMPLE 11

Tests were conducted in the same manner as in Example 14 except that the accelerator was changed to 0.015 mol of triphenylphosphine (TPP).

COMPARATIVE EXAMPLE 12

Tests were conducted in the same manner as in Example 15 except that the accelerator was changed to 0.015 mol of triphenylphosphine (TPP).

COMPARATIVE EXAMPLE 13

Tests were conducted in the same manner as in Example 16 except that the accelerator was changed to 0.008 mol of triphenylphosphine (TPP).

COMPARATIVE EXAMPLE 14

Tests were conducted in the same manner as in Example 17 except that the accelerator was changed to 0.008 mol of triphenylphosphine (TPP).

COMPARATIVE EXAMPLE 15

Tests were conducted in the same manner as in Example 18 except that the accelerator was changed to 0.008 mol of triphenylphosphine (TPP).

COMPARATIVE EXAMPLE 16

Tests were conducted in the same manner as in Example 19 except that the accelerator was changed to 0.008 mol of triphenylphosphine (TPP).

COMPARATIVE EXAMPLE 17

Tests were conducted in the same manner as in Example 20 except that the accelerator was changed to 0.015 mol of triphenylphosphine (TPP).

COMPARATIVE EXAMPLE 18

Tests were conducted in the same manner as in Example 11 except that the accelerator was changed to 0.008 mol of 2-undecylimidazole.

COMPARATIVE EXAMPLE 19

Tests were conducted in the same manner as in Example 12 except that the accelerator was changed to 0.008 mol of 2-undecylimidazole.

COMPARATIVE EXAMPLE 20

Tests were conducted in the same manner as in Example 13 except that the accelerator was changed to 0.015 mol of 2-methylimidazole.

COMPARATIVE EXAMPLE 21

Tests were conducted in the same manner as in Example 14 except that the accelerator was changed to 0.015 mol of 2-methylimidazole.

COMPARATIVE EXAMPLE 22

Tests were conducted in the same manner as in Example 15 except that the accelerator was changed to 0.015 mol of 2-methylimidazole.

COMPARATIVE EXAMPLE 23

Tests were conducted in the same manner as in Example 16 except that the accelerator was changed to 0.008 mol of 2-undecylimidazole.

COMPARATIVE EXAMPLE 24

Tests were conducted in the same manner as in Example 17 except that the accelerator was changed to 0.008 mol of 2-undecylimidazole.

COMPARATIVE EXAMPLE 25

Tests were conducted in the same manner as in Example 18 except that the accelerator was changed to 0.008 mol of 2-undecylimidazole.

COMPARATIVE EXAMPLE 26

Tests were conducted in the same manner as in Example 19 except that the accelerator was changed to 0.008 mol of 2-undecylimidazole.

(Evaluation Results)

The results of the foregoing Examples and Comparative Examples are shown in Tables 5 to 10. A method for testing curing behavior is as follows. Further, FIG. 1 is a graph showing the curing behavior of an epoxy resin composition when CURELASTOMETER is used.

Curing Behavior: This was measured by CURELASTOMETER V model manufactured by NSC.
Mold: P-200 Temperature: 175° C. (fluctuated)
Frequency: 100 cycle/min Amplitude Angle: ±1°
Amount of Sample: 4.5 g

TABLE 5

|  | Ex. 11 | EX. 12 | Ex. 13 | Ex. 14 | Ex. 15 |
|---|---|---|---|---|---|
| Glass Transition Temperature (° C.) | 179 | 147 | 138 | 135 | 119 |
| Flexural Strength (Kgf/mm2) | 14.9 | 13.5 | 12 | 12.5 | 12.3 |
| Flexural Elastic Modulus (Kgf/mm2) | 1500 | 1540 | 1670 | 1610 | 1650 |
| Post-Boiling Water Absorption (%) | 0.16 | 0.09 | 0.08 | 0.11 | 0.09 |
| V.P.S Test (Number of Cracks/10) | 0 | 0 | 0 | 0 | 0 |
| Gelation Time (min' sec") | 3'01" | 3'31" | 5'12" | 5'02" | 5'13" |
| Torque Start tsx (min' sec") | 10" | 19" | 1'05" | 1'12" | 1'10" |
| 10% Cured t' c (min' sec") | 19" | 34" | 1'24" | 1'41" | 1'31" |
| 90% Cured t' c (min' sec") | 2'21" | 3'15" | 2'58" | 3'17" | 3'07" |

TABLE 6

|  | EX. 16 | EX. 17 | Ex. 18 | EX. 19 | Ex. 20 |
|---|---|---|---|---|---|
| Glass Transition Temperature (° C.) | 158 | 129 | 131 | 146 | 140 |
| Flexural Strength (Kgf/mm2) | 13.8 | 13.5 | 13 | 13.6 | 12.2 |
| Flexural Elastic Modulus (Kgf/mm2) | 1460 | 1590 | 1620 | 1530 | 1630 |
| Post-Boiling Water Absorption (%) | 0.14 | 0.11 | 0.12 | 0.14 | 0.13 |
| V.P.S Test (Number of Cracks/10) | 0 | 0 | 0 | 0 | 0 |
| Gelation Time (min' sec") | 3'28" | 3'18" | 3'31" | 3'20" | 5'22" |
| Torque Start tsx (min' sec") | 09" | 11" | 13" | 09" | 1'35" |
| 10% Cured t' c (min' sec") | 22" | 23" | 25" | 21" | 2'07" |
| 90% Cured t' c (min' sec") | 2'55" | 2'45" | 2'37" | 2'35" | 4'57" |

TABLE 7

|  | Comp. EX. 8 | Comp. Ex. 9 | Comp. Ex. 10 | Comp. Ex. 11 | Comp. Ex. 12 |
|---|---|---|---|---|---|
| Glass Transition Temperature (° C.) | 175 | 145 | 106 | 115 | 102 |
| Flexural Strength (Kgf/mm2) | 13.9 | 13.5 | 12.2 | 12.4 | 13 |
| Flexural Elastic Modulus (Kgf/mm2) | 1500 | 1500 | 1550 | 1540 | 1540 |
| Post-Boiling Water Absorption (%) | 0.22 | 0.15 | 0.1 | 0.1 | 0.09 |
| V.P.S Test (Number of Cracks/10) | 2 | 2 | 1 | 1 | 1 |
| Gelation Time (min' sec") | 5'08" | 6'55" | 4'23" | 4'28" | 4'39" |
| Torque Start tsx (min' sec") | 18" | 35" | 29" | 28" | 29" |
| 10% Cured t' c (min' sec") | 23" | 43" | 41" | 39" | 39" |
| 90% Cured t' c (min' sec") | 5'48" | 9'22" | 9'29" | 7'21" | 6'58" |

TABLE 8

|  | Comp. Ex. 13 | Comp. Ex. 14 | Comp. Ex. 15 | Comp. Ex. 16 | Comp. Ex. 17 |
|---|---|---|---|---|---|
| Glass Transition Temperature (° C.) | 152 | 126 | 129 | 147 | 138 |
| Flexural Strength (Kgf/mm2) | 12.8 | 12.8 | 12.6 | 12.7 | 12.3 |
| Flexural Elastic Modulus (Kgf/mm2) | 1440 | 1550 | 1460 | 1515 | 1550 |
| Post-Boiling Water Absorption (%) | 0.21 | 0.17 | 0.18 | 0.22 | 0.13 |
| V.P.S Test (Number of Cracks/10) | 2 | 2 | 2 | 2 | 1 |
| Gelation Time (min' sec") | 5'13" | 6'31" | 6'12" | 5'45" | 4'33" |
| Torque Start tsx (min' sec") | 17" | 21" | 21" | 29" | 29" |
| 10% Cured t' c (min' sec") | 29" | 31" | 30" | 41" | 41" |
| 90% Cured t' c (min' sec") | 5'55" | 6'22" | 16'21" | 6'09" | 6'29" |

TABLE 9

|  | Comp. Ex. 18 | Comp. Ex. 19 | Comp. Ex. 20 | Comp. Ex. 21 | Comp. Ex. 22 |
|---|---|---|---|---|---|
| Glass Transition Temperature (° C.) | 175 | 144 | 107 | 116 | 104 |
| Flexural Strength (Kgf/mm2) | 14.1 | 13.5 | 12.3 | 12.4 | 12.6 |
| Flexural Elastic Modulus (Kgf/mm2) | 1480 | 1510 | 1550 | 1530 | 1510 |
| Post-Boiling Water Absorption (%) | 0.21 | 0.15 | 0.1 | 0.09 | 0.12 |

TABLE 9-continued

|  | Comp. Ex. 18 | Comp. Ex. 19 | Comp. Ex. 20 | Comp. Ex. 21 | Comp. Ex. 22 |
|---|---|---|---|---|---|
| V.P.S Test (Number of Cracks/10) | 2 | 2 | 1 | 1 | 1 |
| Gelation Time (min' sec") | 4'25" | 5'22" | 4'37" | 4'45" | 4'41" |
| Torque Start tsx (min' sec") | 27" 23" | 38" | 30" | 26" |  |
| 10% Cured t' c | 30" | 40" | 59" | 52" | 51" |
| 90% Cured t' c (min' sec") | 5'13" | 6'18" | 9'45" | 7'11" | 6'45" |

TABLE 10

|  | Comp. Ex. 23 | Comp. Ex. 24 | Comp. Ex. 25 | Comp. Ex. 26 |
|---|---|---|---|---|
| Glass Transition Temperature (° C.) | 151 | 125 | 127 | 146 |
| Flexural Strength (Kgf/mm2) | 12.9 | 12.8 | 12.3 | 13.7 |
| Flexural Elastic Modulus (Kgf/mm2) | 1410 | 1470 | 1490 | 1540 |
| Post-Boiling Water Absorption (%) | 0.2 | 0.15 | 0.16 | 0.2 |
| V.P.S Test (Number of Cracks/10) | 2 | 2 | 1 | 2 |
| Gelation Time (min' sec") | 4'52" | 5'19" | 5'22" | 4'55" |
| Torque Start tsx (min' sec") | 22" | 25" | 25" | 25" |
| 10% Cured t' c (min' sec") | 33" | 34" | 36" | 35" |
| 90% Cured t' c (min' sec") | 5'25" | 5'31" | 5'18" | 5'54" |

EXAMPLE 21

0.05 g of phosphazene compound of the formula 1 wherein all R1s were a methyl group was dissolved in 100 g of pure water and then boiled at 95° C. for 20 hours and then at 125° C. for 20 hours (in a glass autoclave). Thereafter, conductivity of the water was measured.

COMPARATIVE EXAMPLE 25

Conductivity was measured in the same manner by use of 0.05 g of tris[tris(dimethylamino)phospholanilidene-amino]phosphine oxide in place of the phosphazene compound of Example 18.

The results of the foregoing Example and Comparative Example are shown in Table 11.

TABLE 11

|  | Ex. 21 | | Comp. Ex. 25 | |
|---|---|---|---|---|
| Processing Temperature | 95° C. | 125° C. | 95° C. | 125° C. |
| Conductivity (μs/cm) | 100 | 104 | 94 | 413 |

As is understood from these conductivities, while the essential phosphazene catalyst in the present invention shows constant conductivity regardless of the processing temperature, thereby inferring it from analogy that the catalyst is stable, the phosphine oxide compound of the Comparative Example shows that conductivity became over four times larger as the temperature increased from 95° C. to 125° C. That is, it is assumed that at high temperatures, it produces a conductive material of some type by decomposition. Therefore, it has been found that they have a large difference with respect to electric characteristics as a sealant.

Further, as has already been described with reference to Examples, it is understood that when a phosphazene compound which is an essential accelerator in the present invention is used in a case where a phenol resin is used as a curing agent, improvements in physical properties such as an increase in Tg and lowered moisture absorptivity can be recognized and, what is more, distinctive curing properties can also be seen, as compared with when conventionally used general-purpose triphenylphosphine is used.

That is, the gelation time is significantly reduced, and the time required for 90% curing in measurement of an increase in torque along with curing by use of the CURELASTOMETER is significantly reduced. This leads to a reduction in cost along with a shortened production cycle in industrial production of a sealant and makes a great contribution from an industrial standpoint.

INDUSTRIAL APPLICABILITY

As described above, the epoxy resin composition obtained by the present invention can be used in industrial fields in which the conventional epoxy resin composition has been used. Particularly, when used as a sealant for a semiconductor, it provides a package with better cracking resistance than the conventional epoxy resin/phenol resin cured product does.

What is claimed is:

1. A curing agent composition for an epoxy resin, comprising a compound as a curing agent (B) which is selected from the group consisting of the following (B1) to (b3):

(B1) a phenol compound having two or more hydroxyl functional groups, (B2) a compound in which a hydroxyl group of a phenol compound having two or more hydroxyl functional groups is esterified with an acyl group, and (B3) a mixture of the compounds (B1) and (B2), and a salt of a phosphazenium compound as a curing accelerator (C) which is represented by the following formula (I):

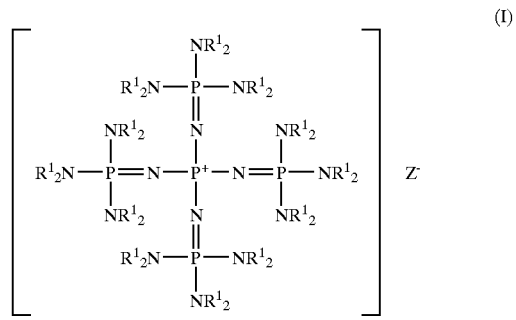

(wherein $R^1$s each represent a hydrogen atom, a linear, branched or cyclic alkyl group having 1 to 10 carbon atoms or an aryl or aralkyl group having 6 to 10 carbon atoms and may be all the same or different from one another; and $Z^-$ represents a halogen anion, hydroxy anion, alkoxy anion, aryloxy anion or carboxy anion).

2. The composition of claim 1, wherein $R^1$s in the formula (1) are each a methyl group or an ethyl group.

3. The composition of claim 1, wherein $Z^-$ in the formula (1) is a hydroxy anion.

4. The composition of claim 1, wherein the curing agent (B) is a novolac resin represented by the following formula (VIII) or an ester derivative thereof, a phenoldicyclopentadiene resin represented by the following formula (IX) or an ester derivative thereof, a phenol aralkyl resin represented by the following formula (X) or an ester derivative thereof, a naphthol aralkyl resin represented by the following formula (XI) or an ester derivative thereof, a biphenol compound represented by the following formula (XII) or an ester derivative thereof, or a bisphenol compound represented by the following formula (XIII) or an ester derivative thereof:

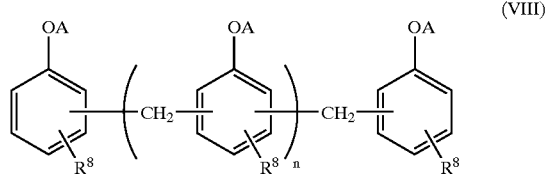

(VIII)

(wherein $R^8$s each represent a hydrogen atom, a methyl group or an ethyl group; n which is the number of recurring units represents an integer of 0 to 50, its average being within a range of 0 to 15; and each A represents a hydrogen atom in the case of the compound (B1) and an aromatic acyl group in the case of the compound (B2)),

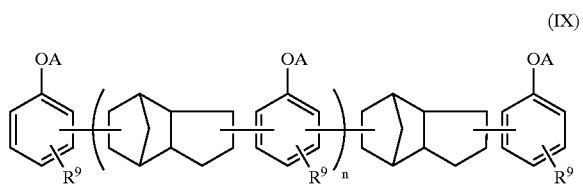

(IX)

(wherein $R^9$s each represent a hydrogen atom, a halogen atom, a linear, branched or cyclic aliphatic alkyl group having 1 to 8 carbon atoms, an alkoxy group having 1 to 10 carbon atoms or a phenyl group; n which is the number of recurring units represents an integer of 0 to 50, its average being within a range of 0 to 15; and each A represents a hydrogen atom in the case of the compound (B1) and an aromatic acyl group in the case of the compound (B2)),

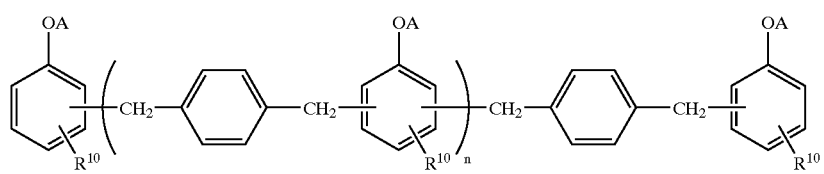

(X)

(wherein $R^{10}$s each represent a hydrogen atom, a halogen atom, a linear, branched or cyclic aliphatic alkyl group having 1 to 8 carbon atoms, an alkoxy group having 1 to 10 carbon atoms or a phenyl group; n which is the number of recurring units represents an integer of 0 to 50, its average being within a range of 0 to 15; and each A represents a hydrogen atom in the case of the compound (B1) and an aromatic acyl group in the case of the compound (B2)), (wherein $R^{11}$s each represent a hydrogen atom, a halogen atom, a linear, branched or cyclic aliphatic alkyl group having 1 to 8 carbon atoms, an alkoxy group having 1 to 10 carbon atoms or a phenyl group; n which is the number of recurring units represents an integer of 0 to 50, its average being within a range of 0 to 15; and each A represents a hydrogen atom in the case of the compound (B1) and an aromatic acyl group in the case of the compound (B2)),

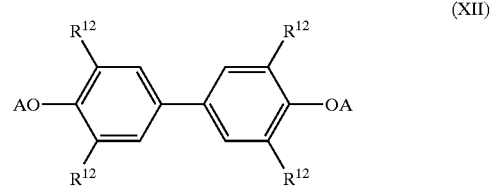

(XII)

(wherein $R^{12}$s each represent a hydrogen atom, a methyl group or an ethyl group and may be all the same or different from one another; and each A represents a hydrogen atom in the case of the compound (B1) and an aromatic acyl group in the case of the compound (B2)), and

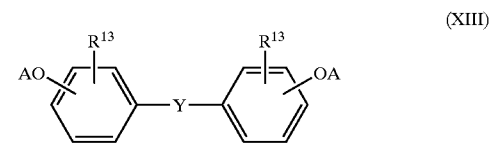

(XIII)

(wherein $R^{13}$s each represent a hydrogen atom, an alkyl group having 1 to 10 carbon atoms, an alkoxyl group having 1 to 10 carbon atoms, an aryl group having 6 to 10 carbon atoms, an aryloxy group having 6 to 10 carbon atoms or halogen and may be all the same or different from one another; Y represents an alkylidene having 1 to 10 carbon atoms, an alkylene having 2 to 10 carbon atoms, a cycloalkylidene having 3 to 10 carbon atoms, a cycloalkylene having 3 to 10 carbon atoms or —O—, —CO—, —CO$_2$—, —S—, —SO— or —SO$_2$—; and each A represents a hydrogen atom in the case of the compound (B1) and an aromatic acyl group in the case of the compound (B2)).

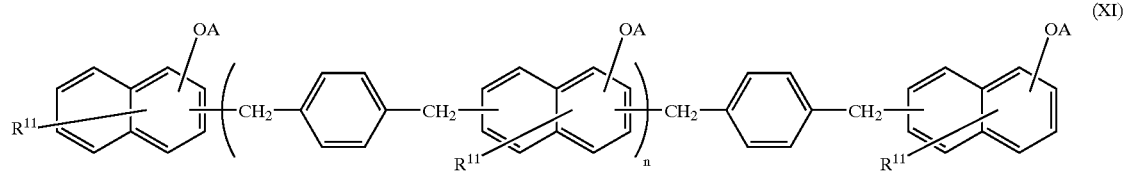

(XI)

5. An epoxy resin composition comprising:
(A) an epoxy resin having two or more epoxy groups in a molecule,
(B) a curing agent, and
(C) a curing accelerator,
wherein the curing agent (B) is a compound selected from the group consisting of the following (B1) to (B3):
(B1) a phenol compound having two or more hydroxyl functional groups,
(B2) a compound in which a hydroxyl group of a phenol compound having two or more hydroxyl functional groups is esterified with an acyl group, and
(B3) a mixture of the (B1) and (B2),
and the curing accelerator (C) is a salt of a phosphazenium compound which is represented by the following formula (I):

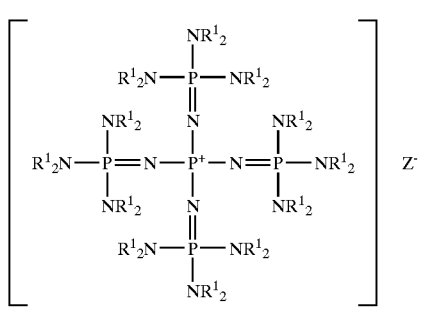

(wherein $R^1$s each represent a hydrogen atom, a linear, branched or cyclic alkyl group having 1 to 10 carbon atoms or an aryl or aralkyl group having 6 to 10 carbon atoms and may be all the same or different from one another; and $Z^-$ represents a halogen anion, hydroxy anion, alkoxy anion, aryloxy anion or carboxy anion).

6. The composition of claim 5, wherein $R^1$s in the formula (1) each represent a methyl group or an ethyl group.

7. The composition of claim 5, wherein $Z^-$ in the formula (1) represents a hydroxy anion.

8. The composition of claim 5, wherein the epoxy resin (A) having two or more epoxy groups in a molecule is a novolac epoxy resin represented by the following formula (II), a phenol-dicyclopentadiene epoxy resin represented by the following formula (III), a phenol-aralkyl-resin epoxy resin represented by the following formula (IV), a naphthol-aralkyl-resin epoxy resin represented by the following formula (V), a biphenol-epoxy-containing epoxy resin represented by the following formula (VI) or a bisphenol-epoxy-containing epoxy resin represented by the following formula (VII):

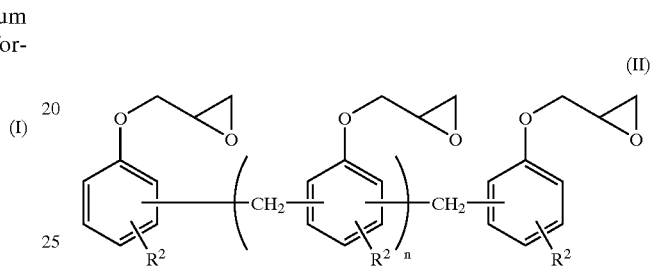

(wherein $R^2$s each represent a hydrogen atom, a methyl group or an ethyl group, and n which is the number of recurring units represents an integer of 0 to 50, its average being within a range of 0 to 15),

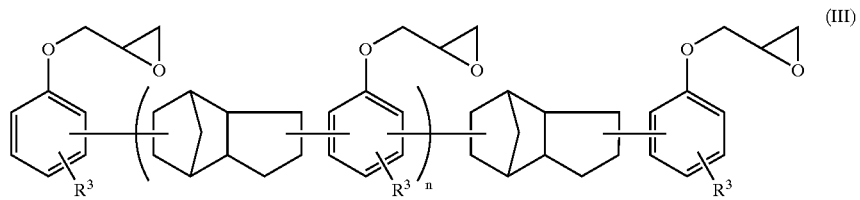

(wherein $R^3$s each represent a hydrogen atom, a halogen atom, a linear, branched or cyclic aliphatic alkyl group having 1 to 8 carbon atoms, an alkoxy group having 1 to 10 carbon atoms or a phenyl group, and n which is the number of recurring units represents an integer of 0 to 50, its average being within a range of 0 to 15),

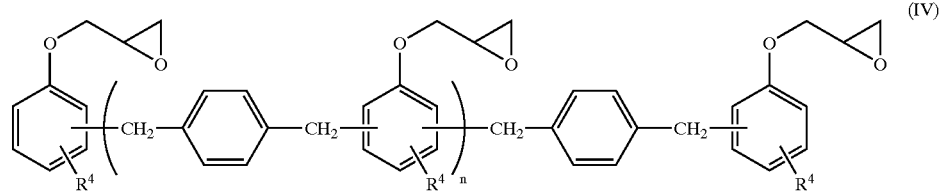

(wherein $R^4$s each represent a hydrogen atom, a halogen atom, a linear, branched or cyclic aliphatic alkyl group having 1 to 8 carbon atoms, an alkoxy group having 1 to 10 carbon atoms or a phenyl group, and n which is the number of recurring units represents an integer of 0 to 50, its average being within a range of 0 to 15),

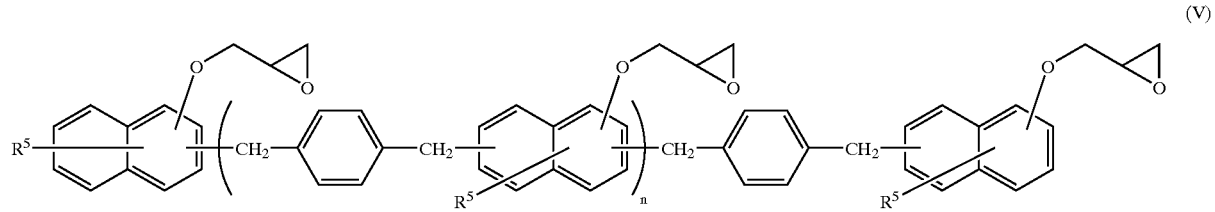

(V)

(wherein R⁵s each represent a hydrogen atom, a halogen atom, a linear, branched or cyclic aliphatic alkyl group having 1 to 8 carbon atoms, an alkoxy group having 1 to 10 carbon atoms, a phenyl group or a glycidyl ether group, and n which is the number of recurring units represents an integer of 0 to 50, its average being within a range of 0 to 15),

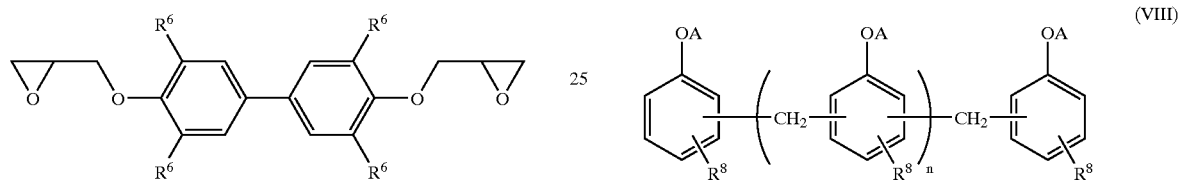

(VI)

(wherein $R^6$s each represent a hydrogen atom, a methyl group or an ethyl group and may be all the same or different from one another), and

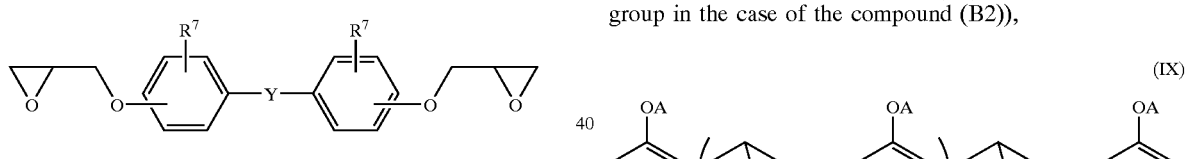

(VII)

(wherein $R^7$s each represent a hydrogen atom, an alkyl group having 1 to 10 carbon atoms, an alkoxyl group having 1 to 10 carbon atoms, an aryl group having 6 to 10 carbon atoms, an aryloxy group having 6 to 10 carbon atoms or halogen and may be all the same or different from one another, and Y represents an alkylidene having 1 to 10 carbon atoms, an alkylene having 2 to 10 carbon atoms, a cycloalkylidene having 3 to 10 carbon atoms, a cycloalkylene having 3 to 10 carbon atoms or —O—, —CO—, —CO₂—, —S—, —SO— or —SO₂—).

9. The composition of claim 5, wherein the curing agent (B) is a novolac resin represented by the following formula (VIII) or an ester derivative thereof, a phenoldicyclopentadiene resin represented by the following formula (IX) or an ester derivative thereof, a phenol aralkyl resin represented by the following formula (X) or an ester derivative thereof, a naphthol aralkyl resin represented by the following formula (XI) or an ester derivative thereof, a biphenol compound represented by the following formula (XII) or an ester derivative thereof, or a bisphenol compound represented by the following formula (XIII) or an ester derivative thereof:

(VIII)

(wherein $R^8$s each represent a hydrogen atom, a methyl group or an ethyl group; n which is the number of recurring units represents an integer of 0 to 50, its average being within a range of 0 to 15; and each A represents a hydrogen atom in the case of the compound (B1) and an aromatic acyl group in the case of the compound (B2)), (IX)

(wherein $R^9$s each represent a hydrogen atom, a halogen atom, a linear, branched or cyclic aliphatic alkyl group having 1 to 8 carbon atoms, an alkoxy group having 1 to 10 carbon atoms or a phenyl group; n which is the number of recurring units represents an integer of 0 to 50, its average being within a range of 0 to 15; and each A represents a hydrogen atom in the case of the compound (B1) and an aromatic acyl group in the case of the compound (B2)),

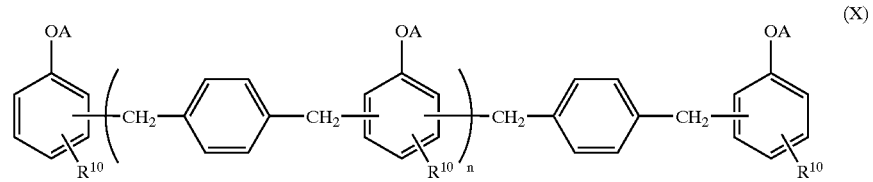

(X)

(wherein $R^{10}$s each represent a hydrogen atom, a halogen atom, a linear, branched or cyclic aliphatic alkyl group having 1 to 8 carbon atoms, an alkoxy group having 1 to 10 carbon atoms or a phenyl group; n which is the number of recurring units represents an integer of 0 to 50, its average being within a range of 0 to 15; and each A represents a hydrogen atom in the case of the compound (B1) and an aromatic acyl group in the case of the compound (B2)),

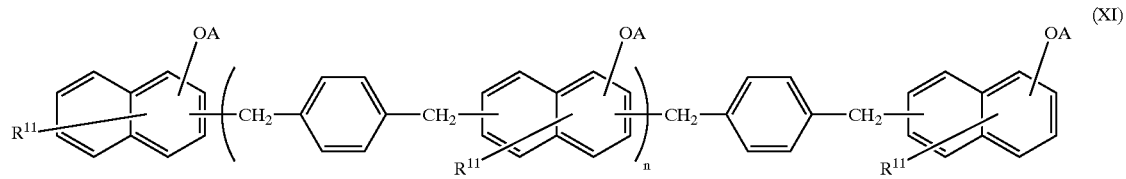
(XI)

(wherein $R^{11}$s each represent a hydrogen atom, a halogen atom, a linear, branched or cyclic aliphatic alkyl group having 1 to 8 carbon atoms, an alkoxy group having 1 to 10 carbon atoms or a phenyl group; n which is the number of recurring units represents an integer of 0 to 50, its average being within a range of 0 to 15; and each A represents a hydrogen atom in the case of the compound (B1) and an aromatic acyl group in the case of the compound (B2)),

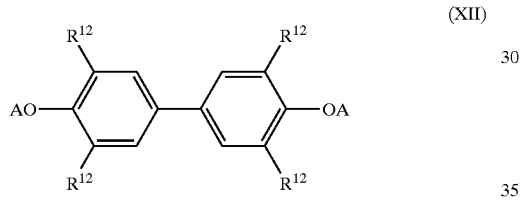
(XII)

(wherein $R^{12}$s each represent a hydrogen atom, a methyl group or an ethyl group and may be all the same or different from one another; and each A represents a hydrogen atom in the case of the compound (B1) and an aromatic acyl group in the case of the compound (B2)), and

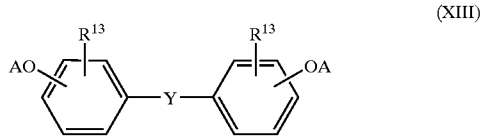
(XIII)

(wherein $R^{13}$s each represent a hydrogen atom, an alkyl group having 1 to 10 carbon atoms, an alkoxyl group having 1 to 10 carbon atoms, an aryl group having 6 to 10 carbon atoms, an aryloxy group having 6 to 10 carbon atoms or halogen and may be all the same or different from one another; Y represents an alkylidene having 1 to 10 carbon atoms, an alkylene having 2 to 10 carbon atoms, a cycloalkylidene having 3 to 10 carbon atoms, a cycloalkylene having 3 to 10 carbon atoms or —O—, —CO—, —CO$_2$—, —S—, —SO— or —SO$_2$—; and each A represents a hydrogen atom in the case of the compound (B1) and an aromatic acyl group in the case of the compound (B2)).

10. The composition of claim 5, containing an organic and/or inorganic filler(s) (D) in an amount of 100 to 1,900 parts by weight based on 100 parts by weight of a total of the epoxy resin (A) having two or more epoxy groups in a molecule and the curing agent (B).

11. A cured epoxy resin obtained by heat-curing the epoxy resin composition of claim 5.

12. A semiconductor device obtained by sealing a semiconductor integrated circuit by use of the epoxy resin composition of claim 5.

* * * * *